United States Patent
Sonehara

(10) Patent No.: US 9,230,646 B2
(45) Date of Patent: Jan. 5, 2016

(54) NONVOLATILE SEMICONDUCTOR MEMORY DEVICE AND CONTROL METHOD THEREOF

(71) Applicant: KABUSHIKI KAISHA TOSHIBA, Minato-ku, Tokyo (JP)

(72) Inventor: Takeshi Sonehara, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 147 days.

(21) Appl. No.: 14/020,583

(22) Filed: Sep. 6, 2013

(65) Prior Publication Data

US 2014/0321194 A1  Oct. 30, 2014

Related U.S. Application Data

(60) Provisional application No. 61/816,113, filed on Apr. 25, 2013.

(51) Int. Cl.
*G11C 13/00* (2006.01)

(52) U.S. Cl.
CPC ........ *G11C 13/0097* (2013.01); *G11C 13/0064* (2013.01); *G11C 2013/0042* (2013.01); *G11C 2013/0054* (2013.01); *G11C 2213/71* (2013.01); *G11C 2213/72* (2013.01)

(58) Field of Classification Search
CPC .. G11C 13/0097; G11C 13/0064; G11C 8/08; G11C 7/1015; G11C 8/14; G11C 5/02; G11C 13/0004; G11C 11/5678; G11C 13/0002; G11C 5/025
See application file for complete search history.

(56) References Cited

U.S. PATENT DOCUMENTS

| 7,978,497 | B2 | 7/2011 | Maejima | |
|---|---|---|---|---|
| 8,071,969 | B2* | 12/2011 | Aoyama | 257/2 |
| 2003/0218897 | A1 | 11/2003 | Kato et al. | |
| 2008/0002457 | A1* | 1/2008 | Toda et al. | 365/148 |
| 2010/0091551 | A1* | 4/2010 | Hosono et al. | 365/148 |
| 2010/0124097 | A1* | 5/2010 | Takase | 365/148 |
| 2010/0214818 | A1 | 8/2010 | Kitagawa et al. | |
| 2011/0176351 | A1 | 7/2011 | Fujitsuka et al. | |

* cited by examiner

*Primary Examiner* — Richard Elms
*Assistant Examiner* — Ajay Ojha
(74) *Attorney, Agent, or Firm* — Holtz, Holtz, Goodman & Chick PC

(57) ABSTRACT

This nonvolatile semiconductor memory device comprises a memory cell array including a plurality of bit lines, a plurality of word lines intersecting the plurality of bit lines, and memory cells provided at intersections of the plurality of bit lines and the plurality of word lines, and further comprises a control unit for controlling a voltage applied to the bit lines and word lines. The memory cell includes a variable resistance element and a rectifier element. The control unit provides a first potential difference to a selected memory cell via a selected bit line and a selected word line, and then provides a second potential difference to the selected memory cell via the selected bit line and the selected word line, the second potential difference being for erasing a residual charge.

20 Claims, 25 Drawing Sheets

Fig. 9
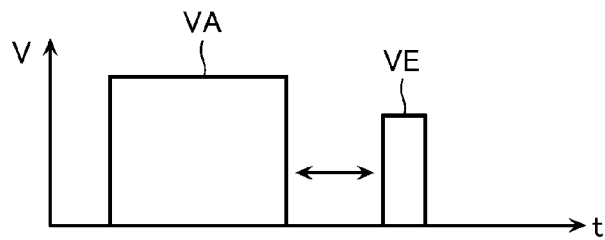
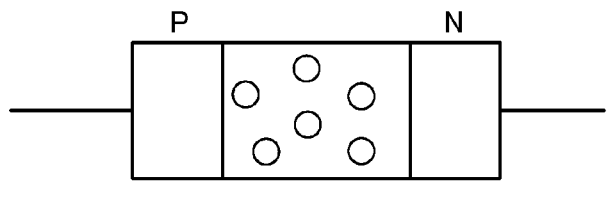
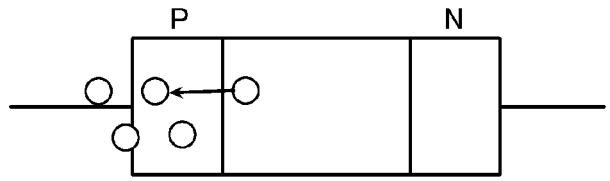
Fig. 10
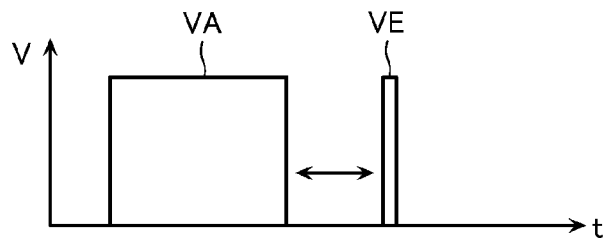
Fig. 11
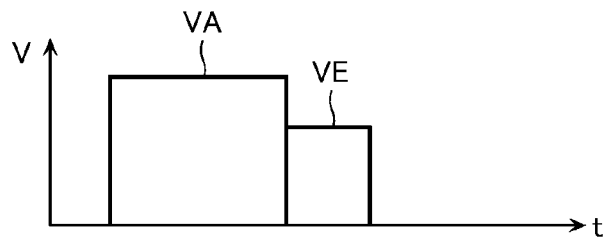

Fig. 26
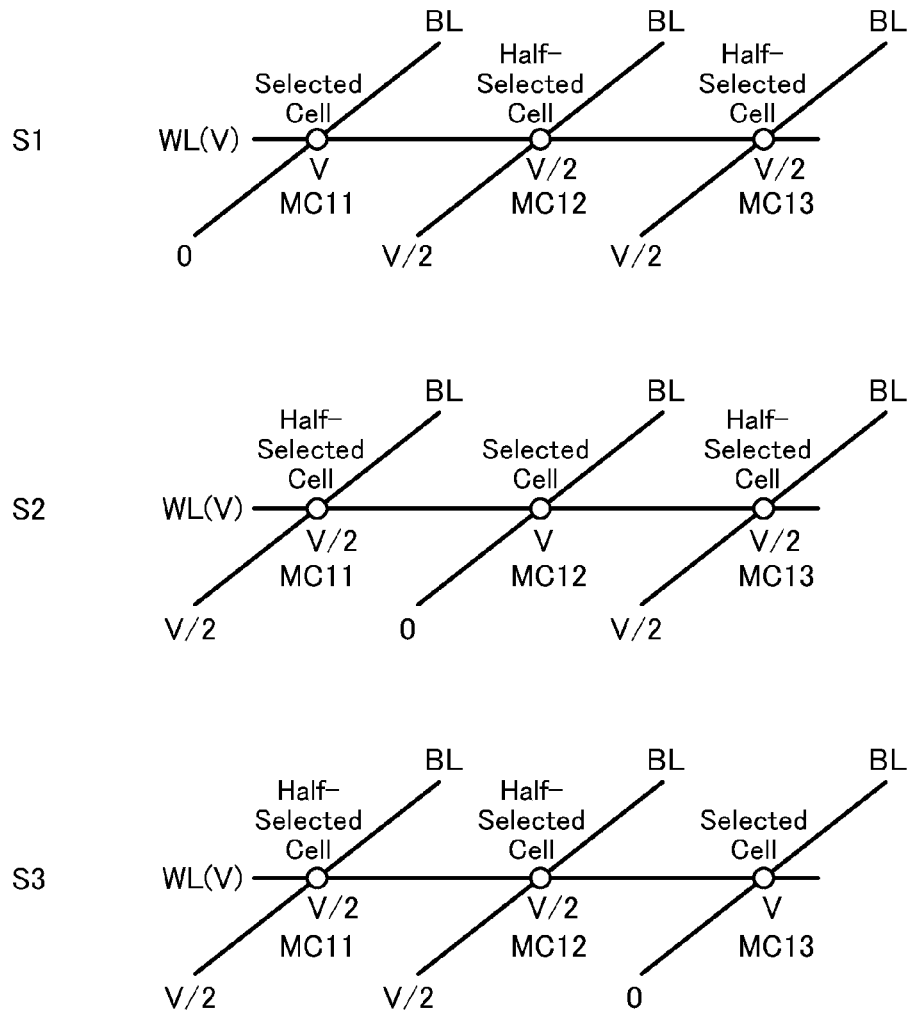
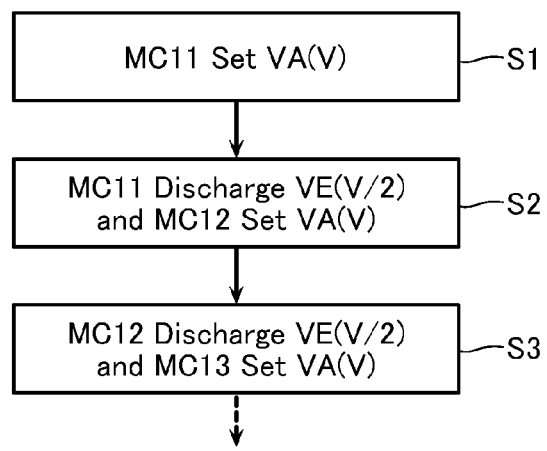

NONVOLATILE SEMICONDUCTOR MEMORY DEVICE AND CONTROL METHOD THEREOF

CROSS REFERENCE TO RELATED APPLICATIONS

This application is based on and claims the benefit of priority from prior US prior provisional Patent Application No. 61/816,113, filed on Apr. 25, 2013, the entire contents of which are incorporated herein by reference.

FIELD

Embodiments described in the present specification relate to a semiconductor memory device and a control method thereof.

BACKGROUND

In recent years, resistance varying memory has been receiving attention as a successor candidate of flash memory. Resistance varying memory usually has a cross-point type structure configured having memory cells arranged in a matrix at intersections of a plurality of bit lines and a plurality of word lines intersecting these bit lines, the memory cell comprising a variable resistance element and a rectifier element.

In such a cross-point type resistance varying memory, the rectifier element is provided to suppress a current flowing in an unselected memory cell. A residual charge occurs in such a rectifier element. This residual charge sometimes causes a malfunction, lowering of operation speed, or the like.

BRIEF DESCRIPTION OF THE DRAWINGS

FIG. 9 is a conceptual diagram showing operation in the first embodiment.

FIG. 10 shows an example of a pulse waveform of a residual charge erase pulse voltage VE.

FIG. 11 shows an example of a pulse waveform of the residual charge erase pulse voltage VE.

FIG. 26 is an example of a conceptual diagram showing operation of a nonvolatile semiconductor memory device according to a sixth embodiment.

DETAILED DESCRIPTION

A semiconductor memory device in an embodiment described below comprises a memory cell array including a plurality of bit lines, a plurality of word lines intersecting the plurality of bit lines, and memory cells provided at intersections of the plurality of bit lines and the plurality of word lines, and further comprises a control unit that controls a voltage applied to the bit lines and word lines. The memory cell includes a variable resistance element and a rectifier element. The control unit provides a first potential difference to a selected memory cell via a selected bit line and a selected word line, and then provides a second potential difference to the selected memory cell via the selected bit line and the selected word line, the second potential difference being for erasing a residual charge.

A nonvolatile semiconductor memory device according to an embodiment will be described below with reference to the drawings.

First Embodiment

Overall System

Figure 1:
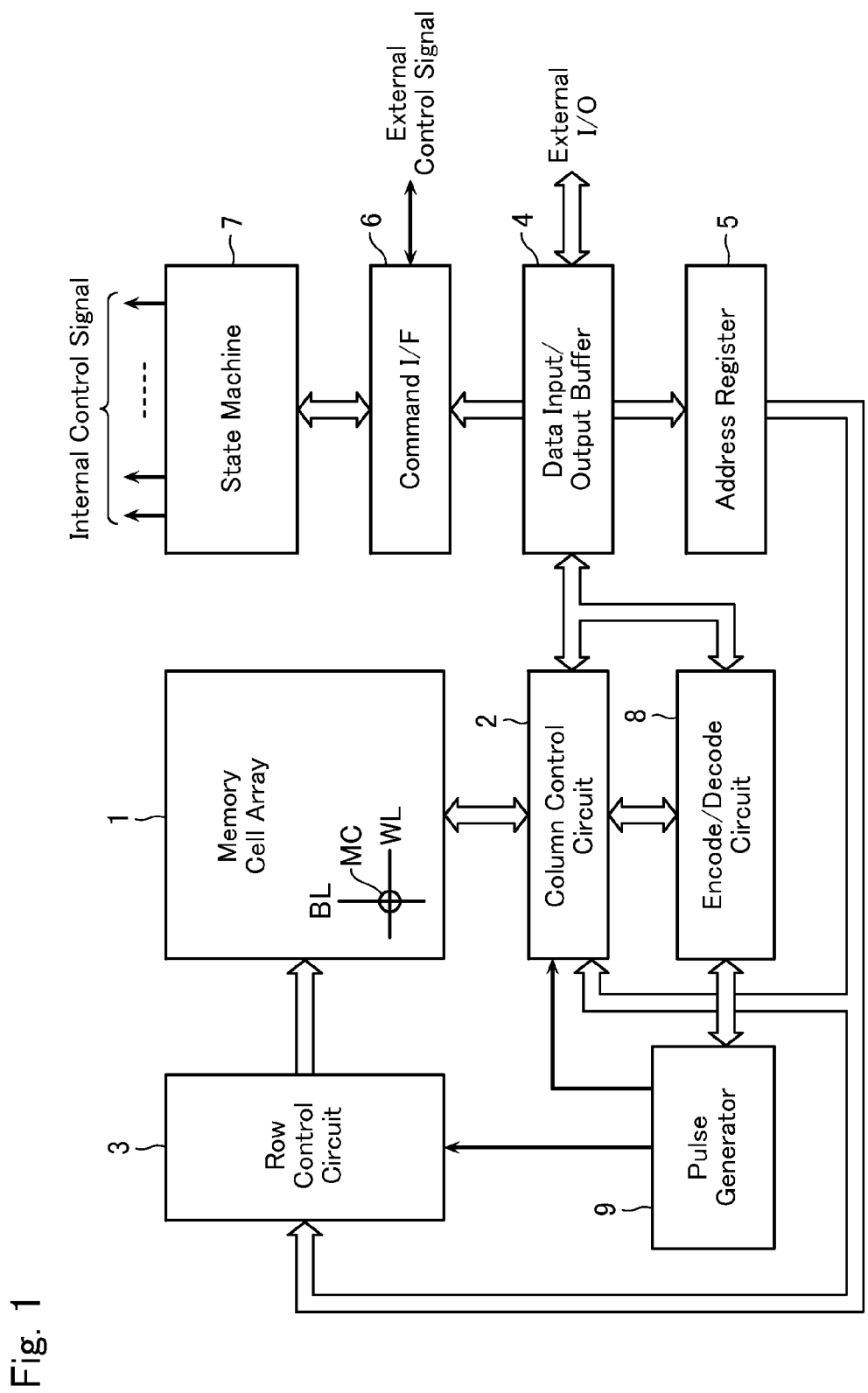
FIG. 1 is an example of a block diagram of a nonvolatile semiconductor memory device according to a first embodiment.

FIG. 1 is an example of a block diagram of a nonvolatile semiconductor memory device according to a first embodiment.

This nonvolatile semiconductor memory device comprises a memory cell array 1 including a plurality of word lines WL, a plurality of bit lines BL intersecting these word lines WL, and a plurality of memory cells MC each provided at each of intersections of these word lines WL and bit lines BL.

A column control circuit 2 is provided at a position adjacent to the memory cell array 1 in a bit line BL direction. The column control circuit 2 controls the bit line BL of the memory cell array 1 to perform data erase of the memory cell MC, data write to the memory cell MC, and data read from the memory cell MC.

In addition, a row control circuit 3 is provided at a position adjacent to the memory cell array 1 in a word line WL direction. The row control circuit 3 selects the word line WL of the memory cell array 1 to apply a voltage required in data erase of the memory cell MC, data write to the memory cell MC, and data read from the memory cell MC.

A data input/output buffer 4 is connected to an external host not illustrated, via an I/O line, to receive write data, receive an erase command, output read data, and receive address data or command data. The data input/output buffer 4 sends received write data to the column control circuit 2, and receives data read from the column control circuit 2 to be outputted. An address supplied to the data input/output buffer 4 is sent to the column control circuit 2 and the row control circuit 3 via an address register 5. Moreover, a command supplied to the data input/output buffer 4 from the host is sent to a command interface 6.

The command interface 6 receives an external control signal from the host to determine whether data inputted to the data input/output buffer 4 is write data or a command or an address, and, if a command, receive the data and transfer the data to a state machine 7 as a command signal.

The state machine 7 performs management of this nonvolatile semiconductor memory device overall, and receives a command from the host to perform management of read, write, erase, input/output of data, and so on. Moreover, a portion of the column control circuit 2, the row control circuit 3, the data input/output buffer 4, the address register 5, the command interface 6, and the state machine 7 is sometimes referred to as a "control circuit".

In addition, data inputted to the data input/output buffer 4 from the host is transferred to an encode/decode circuit 8, and an output signal of the encode/decode circuit 8 is inputted to a pulse generator 9. This input signal causes the pulse generator 9 to output a write pulse of a certain voltage and a certain timing. The pulse generated and outputted by the pulse generator 9 is transferred to any wiring line selected by the column control circuit 2 and the row control circuit 3.

<Memory Cell>

Next, the memory cell MC employed in the embodiment shown in FIG. 1 will be described.

The memory cell MC of the present embodiment includes a memory element and a rectifier element connected in series at the intersection of the word line WL and the bit line BL.

A variable resistance element or a phase change element may be employed as the memory element. A variable resistance element refers to an element configured from a material that changes its resistance value due to a voltage, a current, heat, or the like. A phase change element refers to an element configured from a material that changes its physical property such as a resistance value or capacitance, due to a phase change.

Now, phase change (phase transition) includes aspects listed below.

(1) metal-semiconductor transition, metal-insulator transition, metal-metal transition, insulator-insulator transition, insulator-semiconductor transition, insulator-metal transition, semiconductor-semiconductor transition, semiconductor-metal transition, or semiconductor-insulator transition (2) quantum state phase change such as metal-superconductor transition, and so on (3) paramagnet-ferromagnet transition, antiferromagnet-ferromagnet transition, ferromagnet-ferromagnet transition, ferrimagnet-ferromagnet transition, or transition configured from a combination of these transitions (4) paraelectric-ferroelectric transition, paraelectric-pyroelectric transition, paraelectric-piezoelectric transition, ferroelectric-ferroelectric transition, antiferroelectric-ferroelectric transition, or transition configured from a combination of these transitions (5) transition configured from a combination of the transitions of (1)~(4) above, for example, transition from metal, insulator, semiconductor, ferroelectric, paraelectric, pyroelectric, piezoelectric, ferromagnet, ferrimagnet, helimagnet, paramagnet, or antiferromagnet to ferroelectric ferromagnet, or a reverse transition thereof Materials with these properties are suitable to use as a phase change element in a variable resistance element, and a variable resistance element in the present embodiment is mainly assumed to mean an element configured from a metal oxide, a metal compound, an organic thin film, carbon, a carbon nanotube, and so on.

Moreover, a resistance varying memory in the present embodiment includes ReRAM which adopts a variable resistance element as the memory element, PCRAM that adopts a phase change element as the memory element, MRAM, and so on.

Figure 2:
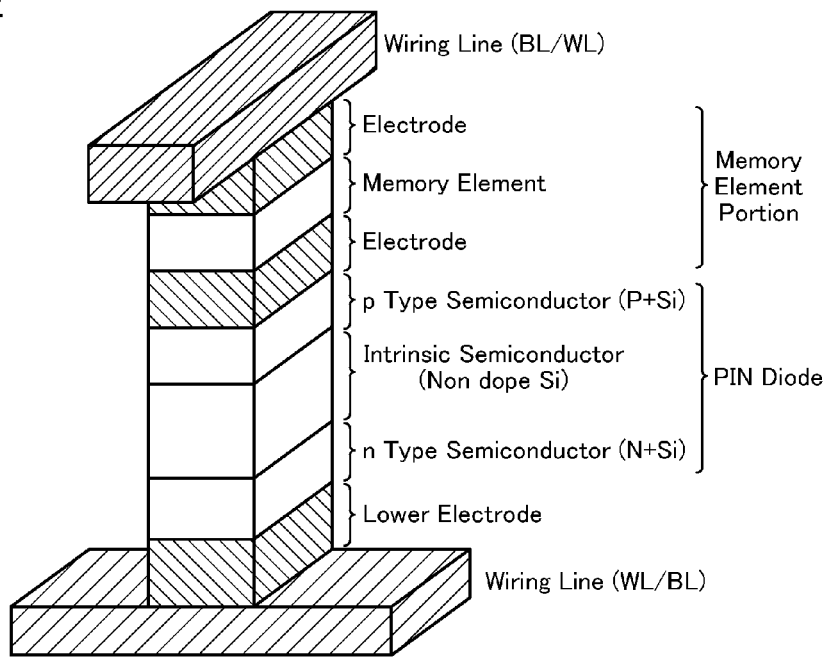
FIG. 2 is an example of a perspective view of a memory cell MC in the case where a PIN diode is employed as a rectifier element.

FIG. 2 is an example of a perspective view of the memory cell MC in the case where a PIN diode is employed as the rectifier element.

As shown in FIG. 2, the memory cell MC is provided at the intersection of the word line WL (or bit line BL) in a lower layer and the bit line BL (or word line WL) in an upper layer. The memory cell MC is formed in a columnar shape having stacked, from the lower layer to the upper layer, a lower electrode, a PIN diode configured from an n type semiconductor (N+Si)/intrinsic semiconductor (Non dope Si)/p type semiconductor (P+Si), and a memory element portion configured from an electrode/memory element/electrode. Note that a film thickness of the PIN diode is set in a range of 50~150 nm.

Figure 3:
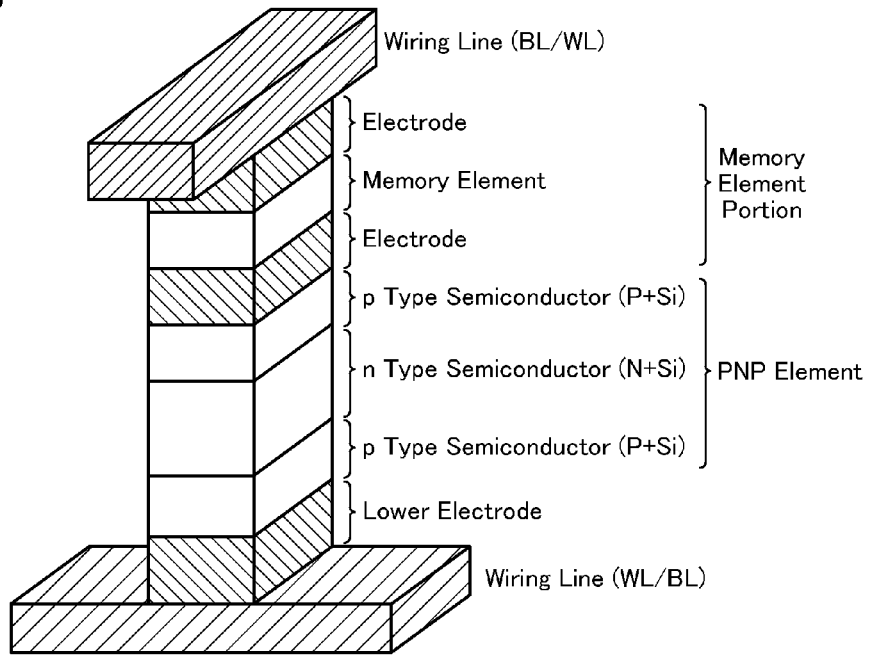
FIG. 3 is an example of a perspective view of a memory cell MC in the case where a PNP element is employed as a rectifier element.

FIG. 3 is an example of a perspective view of the memory cell MC in the case where a PNP element is employed as the rectifier element.

As shown in FIG. 3, the memory cell MC is provided at the intersection of the word line WL (or bit line BL) of the lower layer and the bit line BL (or word line WL) of the upper layer. The memory cell MC is formed having stacked, from the lower layer to the upper layer, the lower electrode, the PNP element configured from the p type semiconductor (P+Si)/n type semiconductor (N+Si)/p type semiconductor (P+Si), and the memory element portion.

A film thickness of this PNP element is also set in a range of 50~150 nm. Moreover, an NPN element configured from the n type semiconductor (N+Si)/p type semiconductor (P+Si)/n type semiconductor (N+Si) may also be used as the rectifier element of the memory cell MC, instead of the PNP element.

As is clear from FIGS. 2 and 3, these memory cells MC can be formed as a cross-point type, hence can achieve a large memory capacity by three-dimensional integration. Moreover, due to characteristics of the variable resistance element, the cross-point type resistance varying memory is potentially capable of achieving a high-speed operation exceeding that of flash memory.

Description proceeds below mainly assuming the memory element to be a variable resistance element such as ReRAM.

In the case where the memory cell array 1 is three-dimensionally structured, combinations of a positional relationship of the variable resistance element and the rectifier element and an orientation of the rectifier element in the memory cell MC can be variously selected for each layer.

Figure 4:
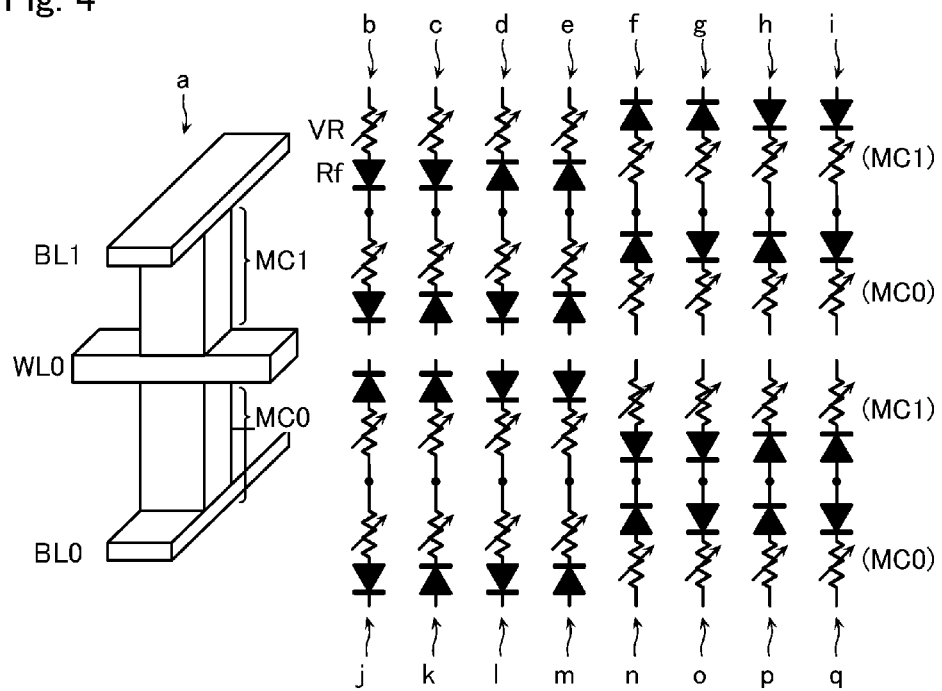
FIG. 4 is an example of a view explaining patterns of combinations of a memory cell MC0 that belongs to a memory cell array 1 of a lower layer and a memory cell MC1 that belongs to a memory cell array 1 of an upper layer, in the case where a word line WL0 is shared by the memory cells MC0 and MC1.

FIG. 4, as shown by a in FIG. 4, is a view explaining patterns of combinations of a memory cell MC0 that belongs to the memory cell array 1 of a lower layer and a memory cell MC1 that belongs to the memory cell array 1 of an upper layer, in the case where a word line WL0 is shared by the memory cells MC0 and MC1. Note that although in FIG. 4, for convenience, the rectifier element is expressed by a symbol for a diode, the rectifier element is not limited to being a diode.

As shown by b~q in FIG. 4, 16 types of patterns are are conceivable as combinations of the memory cell MC0 and the memory cell MC1. These 16 types include inverting an arrangement relationship of the variable resistance element VR and the rectifier element Rf, inverting the orientation of the rectifier element Rf, and so on. These patterns may be selected giving consideration to operation characteristics, an operation system, manufacturing processes, and so on.

<Data Write/Erase Operations>

Next, data write/erase operations on the memory cell MC will be described. Below, a write operation for causing the variable resistance element VR to undergo transition from a high-resistance state to a low-resistance state is called a "setting operation", and an erase operation for causing the variable resistance element VR to undergo transition from a low-resistance state to a high-resistance state is called a "resetting operation". Note that current values, voltage values and so on appearing in the description below are merely one example, and differ according to a material, size, and so on, of the variable resistance element VR or rectifier element Rf.

Figure 5:
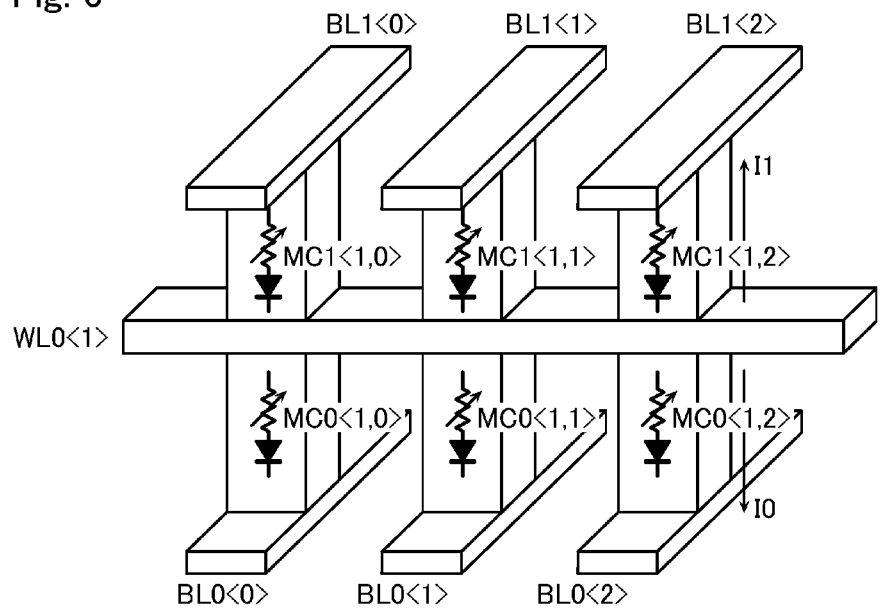
FIG. 5 is an example of a schematic view showing part of the memory cell array 1.

FIG. 5 is a schematic view showing part of the memory cell array 1. In the case of FIG. 5, the memory cell MC0 in the lower layer is provided at the intersection of the bit line BL0 and the word line WL0. The memory cell MC1 in the upper layer is provided at the intersection of the word line WL0 and the bit line BL1. The word line WL0 is shared by the memory cell MC0 and the memory cell MC1.

Moreover, the combination of placement of the memory cells MC0 and MC1 will be described using the pattern of b in FIG. 4. In other words, the memory cell MC0 is stacked in order of the rectifier element Rf and the variable resistance element VR, from the bit line BL0 to the word line WL0. The rectifier element Rf is disposed with an orientation having a direction from the word line WL0 to the bit line BL0 as a forward direction. On the other hand, the memory cell MC1 is stacked in order of the rectifier element Rf and the variable resistance element VR, from the word line WL0 to the bit line BL1. The rectifier element Rf is disposed with an orientation having a direction from the bit line BL1 to the word line WL0 as a forward direction.

Setting/resetting operations in the case where the memory cell MC0<1,1> provided at the intersection of the bit line BL0<1> and the word line WL0<1> is assumed to be a selected memory cell, are here considered.

There are two methods of setting/resetting operations on the memory cell MC, namely a unipolar operation for achieving the setting operation and the resetting operation by bias applications of identical polarity, and a bipolar operation for achieving the setting operation and the resetting operation by bias applications of different polarity.

First, the unipolar operation will be described.

In the setting operation, a current having a current density of $1\times10^5 \sim 1\times10^7$ A/cm$^2$, or a voltage of 1~2 V must be applied to the variable resistance element VR. Therefore, when performing the setting operation on the memory cell MC, a forward direction current must be passed through the rectifier element Rf so that such a certain current or voltage is applied.

In the resetting operation, a current having a current density of $1\times10^3 \sim 1\times10^6$ A/cm$^2$, or a voltage of 1~3V must be applied to the variable resistance element VR. Therefore, when performing the resetting operation on the memory cell MC, a forward direction current must be passed through the rectifier element Rf so that such a certain current or voltage is applied.

Figure 6:
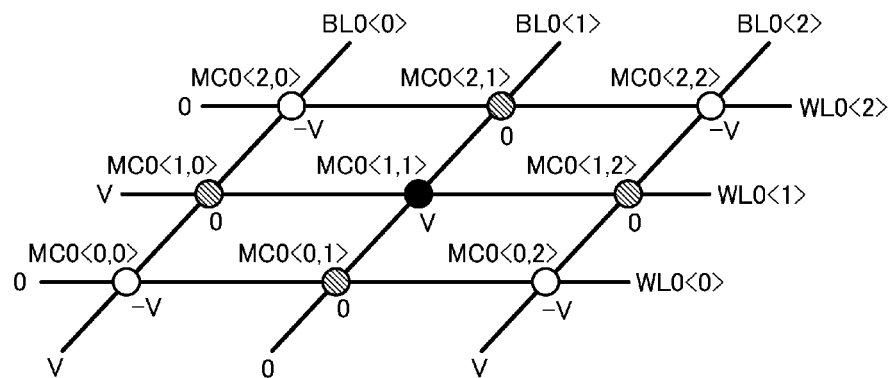
FIG. 6 is an example of a conceptual diagram showing applied voltages in the case of executing a unipolar operation where a setting operation and a resetting operation are achieved by a bias application of identical polarity.

In the unipolar operation, it is only required to apply to the memory cell array 1 a bias such as in FIG. 6, for example.

In other words, as shown in FIG. 6, the selected word line WL0<1> is supplied with a certain voltage V (for example, 3 V), and the other word lines WL0<0> and WL0<2> are supplied with 0 V. Moreover, the selected bit line BL0<1> is supplied with 0 V, and the other bit lines BL0<0> and BL0<2> are supplied with the voltage V.

As a result, the selected memory cell MC0<1,1> is supplied with a potential difference V. The unselected memory cells MC0<0,0>, MC0<0,2>, MC0<2,0>, and MC0<2,2> connected to the unselected word lines WL0<0> and WL0<2> and unselected bit lines BL0<0> and BL0<2> are supplied with a potential difference −V. The other memory cells MC0, in other words, the unselected memory cells (below referred to as "half-selected memory cells") MC0<1,0>, MC0<1,2>, MC0<0,1>, and MC0<2,1> connected only to either the selected word line WL0<1> or the selected bit line BL0<1> are supplied with a potential difference 0.

In this case, the non-osmic an element such as a diode having a voltage-current characteristic preventing current flow up to −V with respect to reverse bias, but allowing steep current flow with respect to forward bias is needed. Employing such an element in the memory cell MC allows the setting/resetting operations to be performed only on the selected memory cell MC0<1,1>.

Next, the bipolar operation will be described.

In the case of the bipolar operation, the following points must be considered, namely that (1) contrary to the case of the unipolar operation, current is passed bi-directionally in the memory cell MC, (2) the operation speed, operation current, and operation voltage change from those of the unipolar operation, and (3) a bias is applied also to the half-selected memory cells MC.

Figure 7:
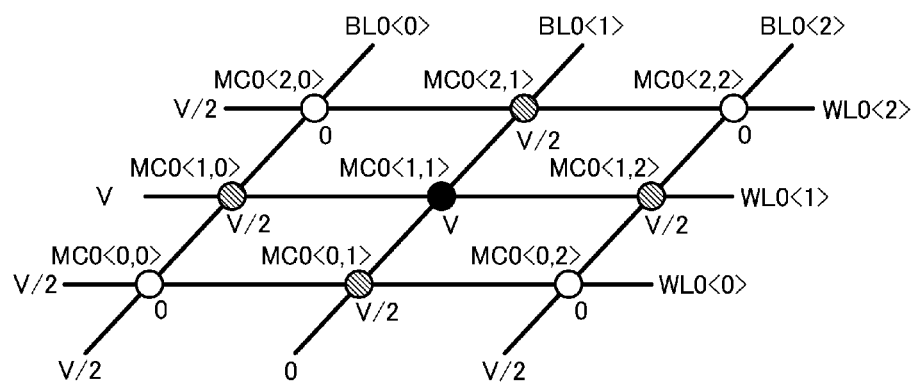
FIG. 7 is an example of a conceptual diagram showing applied voltages in the case of executing a bipolar operation where the setting operation and the resetting operation are achieved by a bias application of different polarity.

FIG. 7 is an example of a view showing a state of bias application to the memory cell array 1 during the bipolar operation. In the bipolar operation, it is only required to apply to the memory cell array 1 a bias such as in FIG. 7, for example.

In other words, as shown in FIG. 7, the selected word line WL0<1> is supplied with a certain voltage V (for example, 3 V), and the other word lines WL0<0> and WL0<2> are supplied with V/2 (for example, 1.5 V). Moreover, the selected bit line BL0<1> is supplied with 0 V, and the other bit lines BL0<0> and BL0<2> are supplied with the voltage V/2.

As a result, the selected memory cell MC0<1,1> is supplied with a potential difference V. The unselected memory cells MC0<0,0>, MC0<0,2>, MC0<2,0>, and MC0<2,2> connected to the unselected word lines WL0<0> and WL0<2> and unselected bit lines BL0<O> and BL0<2> are supplied with a potential difference 0. The other memory cells MC0, in other words, the unselected memory cells (half-selected memory cells) MC0<1,0>, MC0<1,2>, MC0<0,1>, and MC0<2,1> connected only to either the selected word line WL0<1> or the selected bit line BL0<1> are supplied with V/2.

Therefore, in the bipolar operation, a rectifier element having characteristics that preventing current flow at a potential difference V/2 or less is needed.

Figure 8:
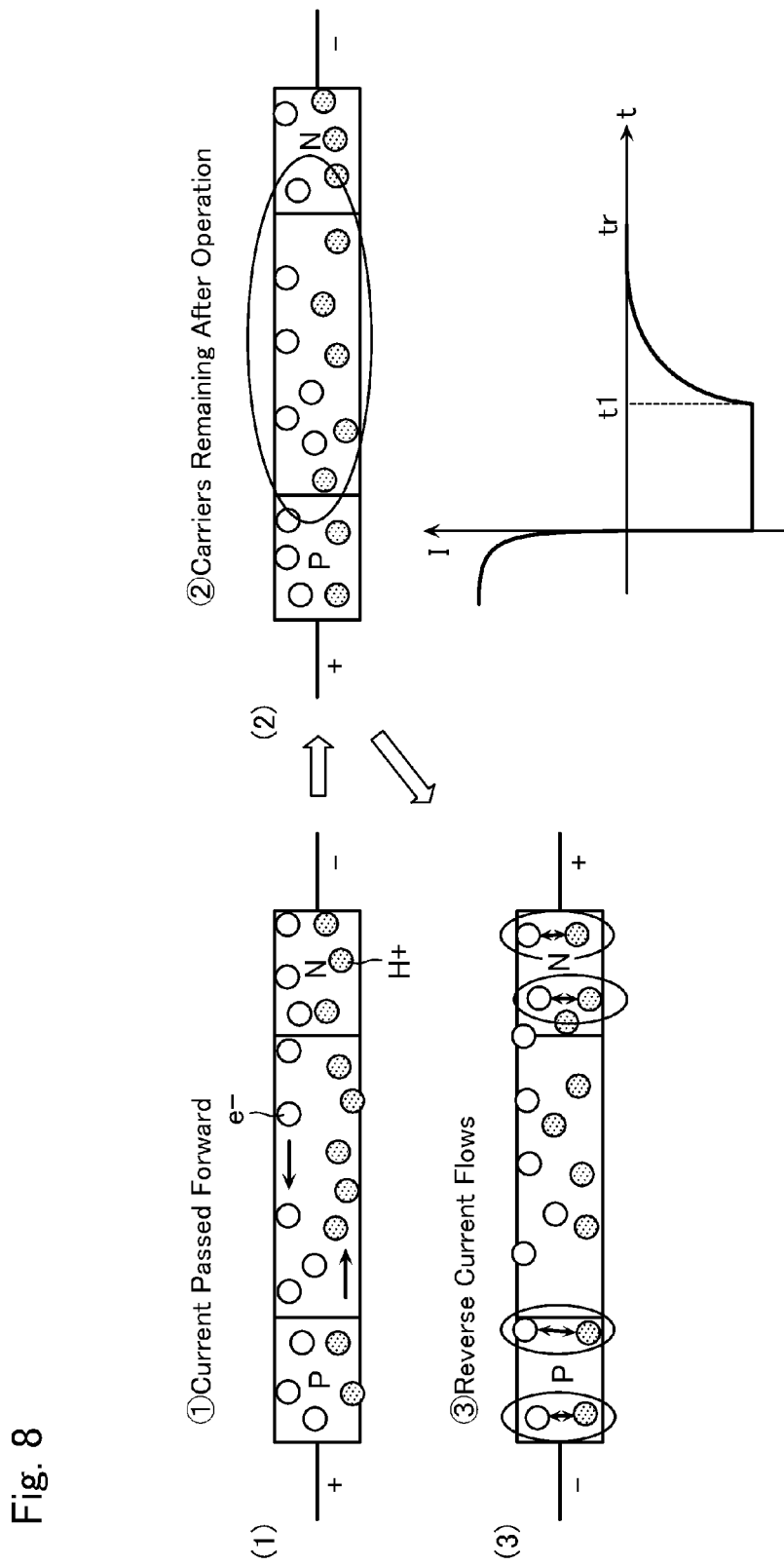
FIG. 8 is an example of a view explaining a residual charge of a diode.

As described above, when a selected memory cell is selected for the setting operation or the resetting operation, a certain current flows in that selected memory cell, regardless of whether the unipolar operation or the bipolar operation is adopted. For example, as shown in FIG. 6, the case is assumed where the memory cell MC0<1,1> is selected as the selected memory cell in the setting operation or the resetting operation. In this case, when application of a voltage (voltage V) to the selected memory cell MC0<1,1> finishes after completion of the setting operation or the resetting operation in the selected memory cell MC0<1,1>, current flowing in the selected memory cell MC0<1,1> ideally becomes zero instantaneously. However, as shown in FIG. 8, regarding an actual selected memory cell MC0<1,1>, a reverse recovery current sometimes flows in the selected memory cell MC0<1,1>, although only for a short time, even after voltage application has finished. Moreover, immediately after voltage application to the selected memory cell has finished, a residual charge sometimes remains in, for example, an intrinsic semiconductor portion of a PIN diode or a junction portion of a PN diode. This residual charge is prominent particularly in the case where the selector is the diode and current is increased using an impact ionization phenomenon.

Now, these reverse recovery current or residual charge are sometimes an obstacle to the setting operation or resetting operation in a memory cell next targeted for the setting operation or resetting operation. That is, while a reverse recovery current is flowing in the memory cell MC0<1,1> after completion of the setting operation or resetting operation, for example, the likes of the memory cells MC0<1,0>, MC0<1,2>, MC0<0,1>, or MC0<2,1> are newly selected. It is possible to cause a miss function in the setting operation or resetting operation or an increase in power consumption. This is because effects of the reverse recovery current flowing in the immediately prior selected memory cell MC0<1,1> or of the residual charge cause a potential of the selected bit line BL or selected word line WL to change.

Accordingly, the semiconductor memory device of the present embodiment is configured to, when performing the likes of the setting operation, resetting operation, or a read operation, execute an operation such as shown in FIG. 9 by control of the control circuit of the state machine 7 and so on.

First, as shown in FIG. 9, an operation pulse voltage VA for each kind of operation (setting operation, resetting operation, read operation, and so on) is applied. When this operation pulse voltage VA is applied, a large amount of charge (holes, electrons) is generated in the rectifier element in the memory cell MC. This charge remains for a while even after application of the operation pulse voltage VA has finished, and a reverse direction current flows based on this.

In order to cancel such a reverse direction current and eliminate the residual charge, a residual charge erase pulse voltage VE is applied after finishing application of the operation pulse voltage VA. As a result, as shown in FIG. 9, the residual charge flows out from the rectifier element. Due to eliminating the residual charge, an accurate setting operation, resetting operation, or read operation can be executed without occurrence of any disturbance based on this residual charge, even if each of the various operations has shifted to the next memory cell.

Figure 12:
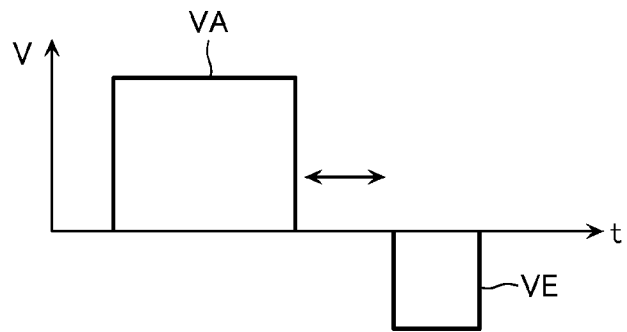
FIG. 12 shows an example of a pulse waveform of the residual charge erase pulse voltage VE.
Figure 13:
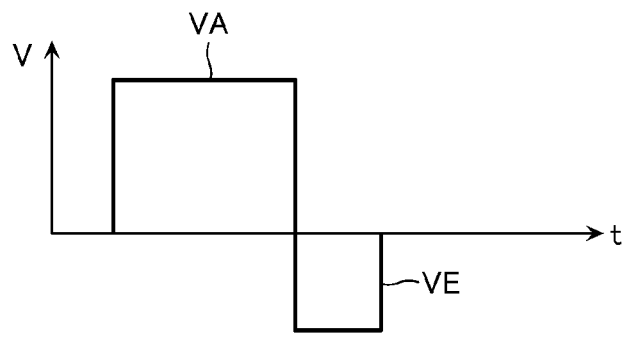
FIG. 13 shows an example of a pulse waveform of the residual charge erase pulse voltage VE.
Figure 14:
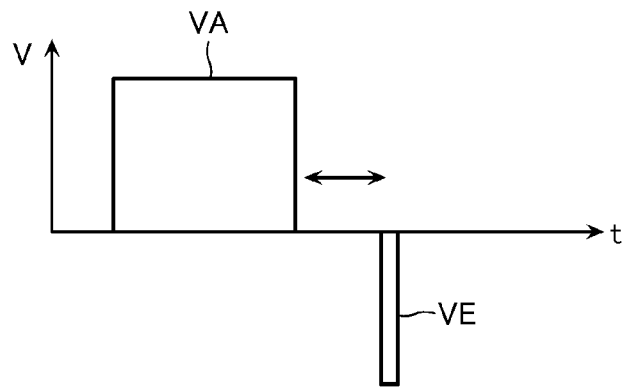
FIG. 14 shows an example of a pulse waveform of the residual charge erase pulse voltage VE.

FIGS. 10~14 show examples of pulse waveforms of the residual charge erase pulse voltage VE. FIGS. 10~11 are of cases where the polarity of the residual charge erase pulse voltage VE is the same as the polarity of the operation pulse voltage VA, and FIGS. 12~14 are of cases of the reverse. The most appropriate form may be adopted for the relationship between the polarity of the operation pulse voltage VA and the polarity of the residual charge erase pulse voltage VE, based on which of the unipolar operation or the bipolar operation (FIGS. 6 and 7) is adopted, a kind of operation (setting operation, resetting operation, or read operation), characteristics of the rectifier element, and other characteristics.

Figure 15:
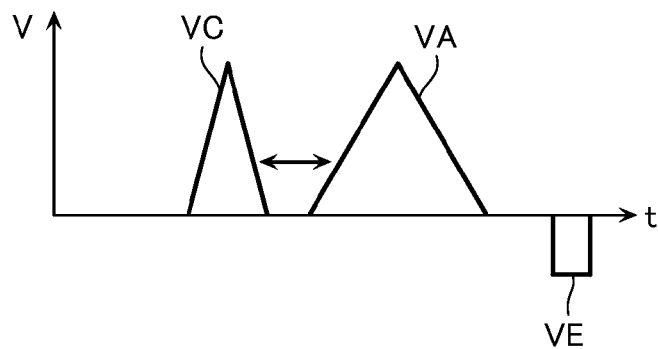
FIG. 15 is an example of an operation waveform in the case where, as a preparation for various kinds of operations, a charge injection pulse voltage VC for injecting a charge into the rectifier element is applied before application of an operation pulse voltage VA.
Figure 16:
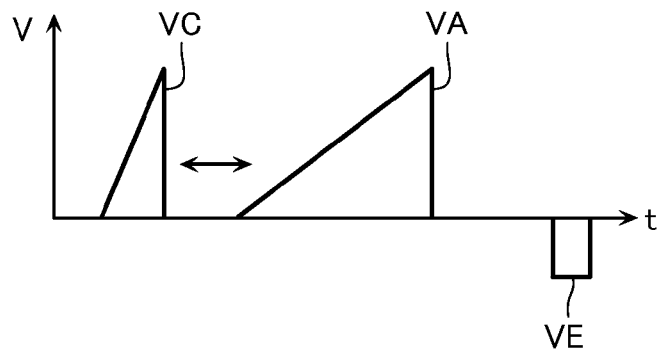
FIG. 16 is an example of an operation waveform in the case where, as a preparation for various kinds of operations, the charge injection pulse voltage VC for injecting a charge into the rectifier element is applied before application of the operation pulse voltage VA.
Figure 17:
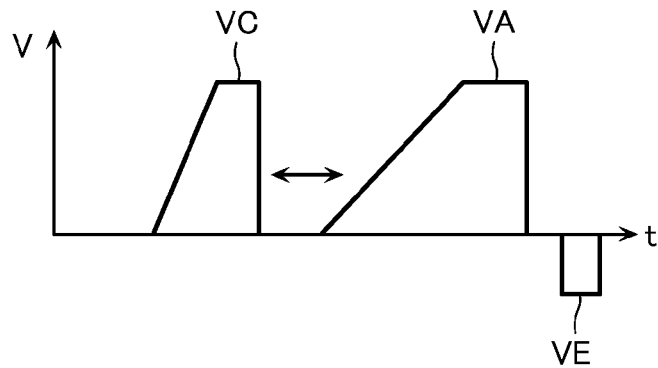
FIG. 17 is an example of an operation waveform in the case where, as a preparation for various kinds of operations, the charge injection pulse voltage VC for injecting a charge into the rectifier element is applied before application of the operation pulse voltage VA.

FIGS. 15~17 are operation waveforms in the case where, as a preparation for various kinds of operations, a charge injection pulse voltage VC for injecting charge into the rectifier element is applied before application of the operation pulse voltage VA. In FIGS. 15~17, the waveforms of the voltages VA, VE, and VC are triangular waveforms, but rectangular waveforms similar to those in FIGS. 10~14 may of course be adopted.

Second Embodiment

Next, a nonvolatile semiconductor memory device according to a second embodiment will be described with reference to FIGS. 18~19B. A schematic configuration of the device of this second embodiment is substantially identical to that in FIGS. 1~5, hence a duplicated description thereof is omitted below.

Also in this embodiment, similarly to in the first embodiment, an operation is performed that, for erase of the residual charge after various kinds of operations, applies the residual charge erase pulse voltage VE after application of the operation pulse voltage VA as the setting operation. However, in this embodiment, as shown in B of FIG. 18 and in FIG. 19A (step S1), when the setting operation is performed, the operation pulse voltage VA is applied such that the resistance value of the memory cell is made more low-resistance than a target resistance value distribution (set state) (below, such an operation is referred to as an "overset operation"). Then, as shown in C of FIG. 18 and in FIG. 19A (step S2), the control circuit applies the residual charge erase pulse voltage VE to the memory cell rendered in an excessively low-resistance state by the overset operation, thereby bringing resistance value of the memory cell into a target range of the resistance value distribution (below, such an operation is referred to as a "partial reset operation"). That is, the residual charge erase pulse voltage VE is used as a weak pulse voltage to write back the resistance value of the memory cell.

Figure 18:
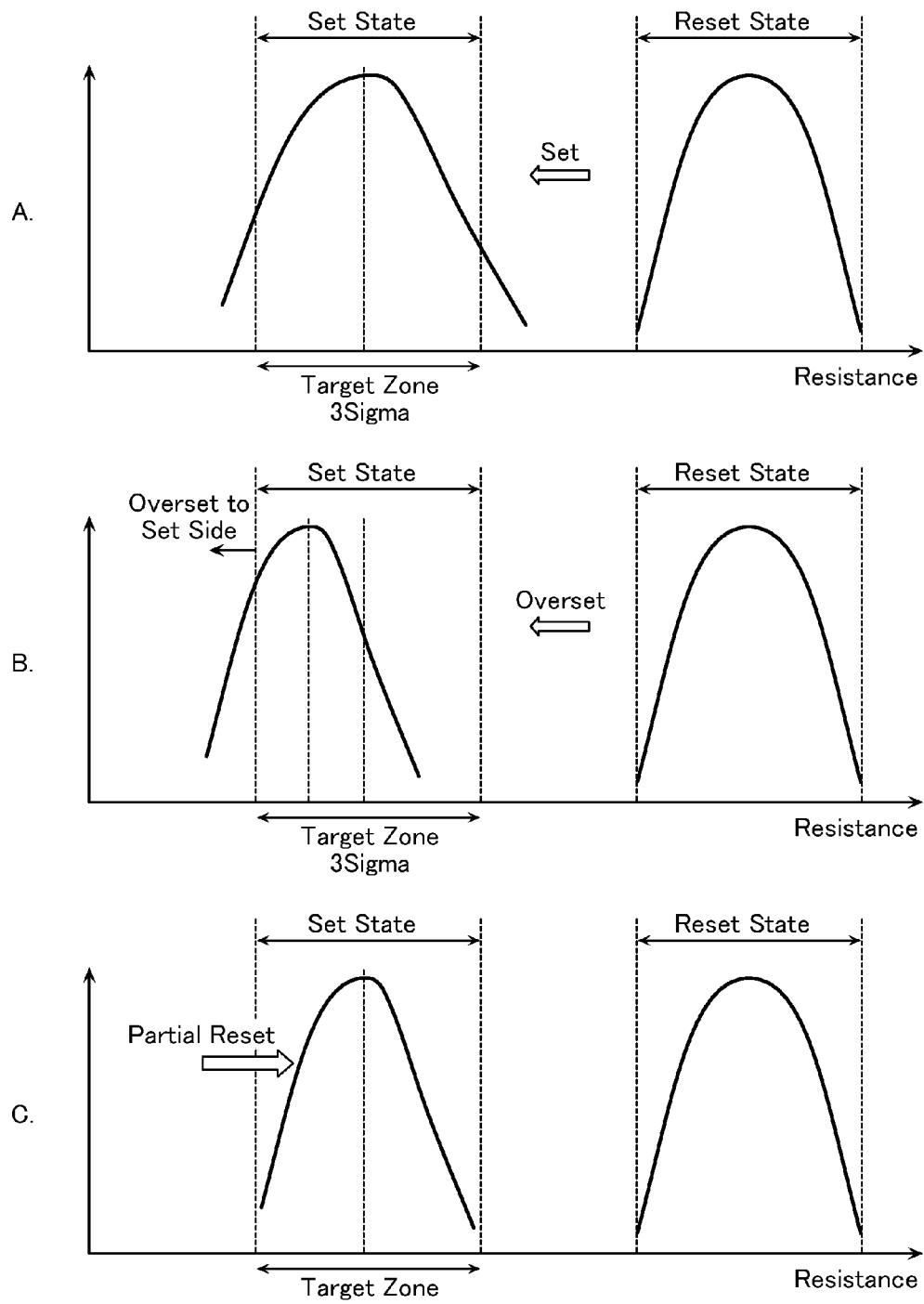
FIG. 18 is an example of a graph showing operation of a nonvolatile semiconductor memory device according to a second embodiment.
Figure 19A:
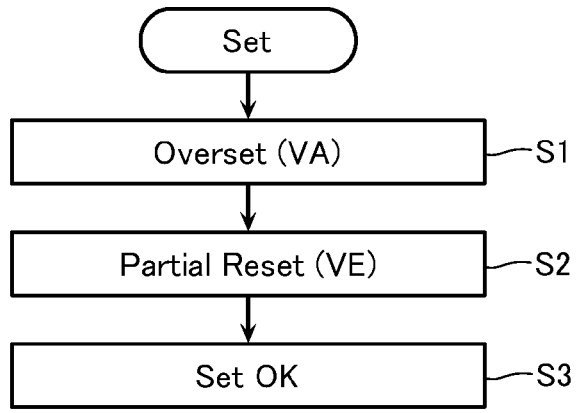
FIG. 19A is an example of a flowchart showing operation of the nonvolatile semiconductor memory device according to the second embodiment.

As shown in A of FIG. 18, when the setting operation is performed on a memory cell in a reset state by the operation pulse voltage VA only, the resistance value distribution of a plurality of the memory cells after the setting operation is sometimes broader than an ideal resistance value distribution. Accordingly, in this embodiment, a voltage value, the number of times of applications and so on of the operation pulse voltage VA are set such that a setting operation is performed so as to exceed the ideal range of the resistance value distribution (overset operation). The resistance value distribution in B of FIG. 18 thus obtained is contrarily returned to a high-resistance side (reset side) by the partial reset operation employing the residual charge erase pulse voltage VE. By so doing, it is possible to bring a width of the resistance value distribution after the setting operation into the target range, while reducing the residual charge.

Figure 19B:
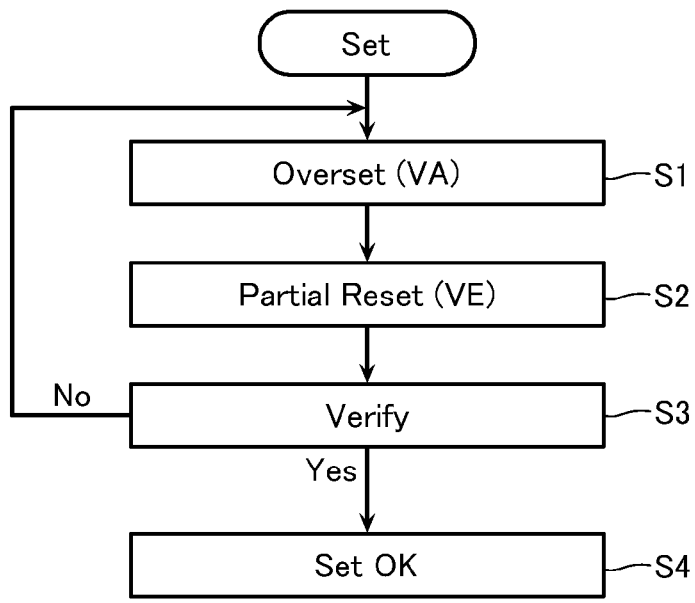
FIG. 19B is an example of a flowchart showing operation of a nonvolatile semiconductor memory device according to a modified example of the second embodiment.

FIG. 19B is a flowchart showing a procedure in a modified example of this second embodiment. In this modified example, after performing the overset operation (S1) and the partial reset operation (S2), a verify read operation for determining whether a set state having the desired resistance value distribution has been achieved or not is executed (step S3). If the target resistance value distribution has been achieved (YES), the setting operation finishes, and if not achieved (NO), the control circuit performs the overset operation employing the operation pulse voltage VA (S1) and the partial reset operation employing the residual charge erase pulse voltage VE (S2). Note that depending on a result of verify read, the overset operation (S1) may be omitted and the partial reset operation (S2) only performed.

Third Embodiment

Figure 20:
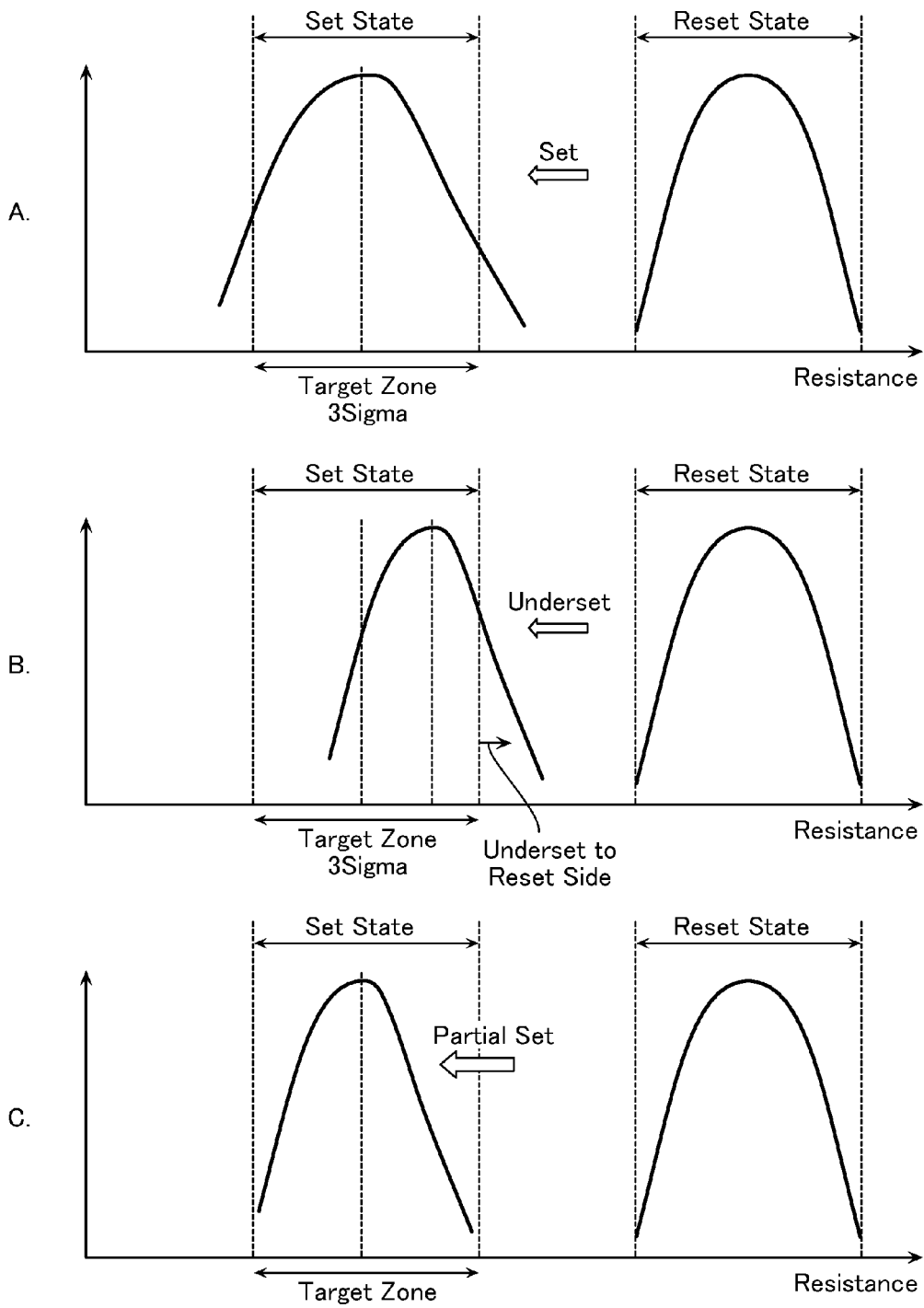
FIG. 20 is an example of a graph showing operation of a nonvolatile semiconductor memory device according to a third embodiment.
Figure 21A:
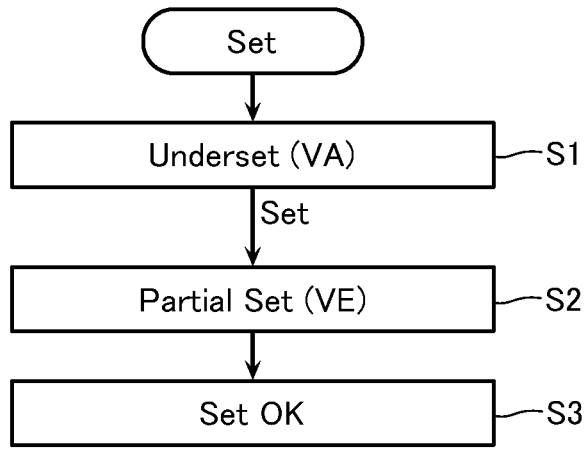
FIG. 21A is an example of a flowchart showing operation of the nonvolatile semiconductor memory device according to the third embodiment.

Next, a nonvolatile semiconductor memory device according to a third embodiment will be described with reference to FIGS. 20~21B. A schematic configuration of the device of this third embodiment is substantially identical to that in FIGS. 1~5, hence a duplicated description thereof is omitted below.

Also in this embodiment, similarly to in the first embodiment, an operation is performed that, for erase of the residual charge after various kinds of operations, applies the residual charge erase pulse voltage VE after application of the operation pulse voltage VA as the setting operation. However, in this embodiment, as shown in B of FIG. 20 and in FIG. 21A (step S1), when the setting operation is performed, the operation pulse voltage VA is applied such that the resistance value of the memory cell is is not made sufficiently low-resistance to reach a target resistance value distribution (below, such an operation is referred to as an "underset operation"). Then, as shown in C of FIG. 20 and in FIG. 21A (step S2), an application of the residual charge erase pulse voltage VE is made to the memory cell rendered in an insufficiently low-resistance state by the underset operation, thereby bringing the memory cell into the target range of the resistance value distribution (below, such an operation is referred to as a "partial set operation"). This operation also allows substantially identical advantages to those of the second embodiment to be obtained.

Figure 21B:
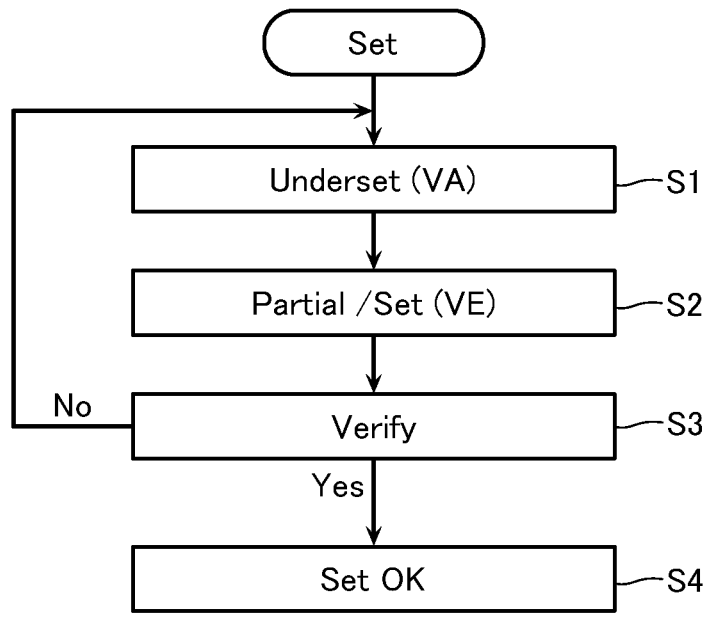
FIG. 21B is an example of a flowchart showing operation of a nonvolatile semiconductor memory device according to a modified example of the third embodiment.

FIG. 21B is a flowchart showing a procedure in a modified example of this third embodiment. In this modified example, after performing the underset operation and the partial set operation, a verify read operation for determining whether a set state having the desired resistance value distribution has been achieved or not is executed (step S3). If the target resistance value distribution has been achieved (YES), the setting operation finishes, and if not achieved (NO), the control circuit performs the underset operation employing the operation pulse voltage VA and the partial set operation employing the residual charge erase pulse voltage VE. Note that depending on a result of verify read, the under set operation (S1) may be omitted and the partial set operation (S2) only performed.

Fourth Embodiment

Next, a nonvolatile semiconductor memory device according to a fourth embodiment will be described with reference to FIGS. 22~23B. A schematic configuration of the device of this fourth embodiment is substantially identical to that in FIGS. 1~5, hence a duplicated description thereof is omitted below.

Also in this embodiment, similarly to in the first embodiment, an operation is performed that, for erase of the residual charge after various kinds of operations, applies the residual charge erase pulse voltage VE after application of the operation pulse voltage VA as the resetting operation. However, in this embodiment, as shown in B of FIG. 22 and in FIG. 23A (step S1), when the resetting operation is performed, the operation pulse voltage VA is applied such that the resistance value of the memory cell is made more high-resistance than a target resistance value distribution (reset state) (below, such an operation is referred to as an "overreset operation"). Then, as shown in C of FIG. 22 and in FIG. 23A (step S2), the residual charge erase pulse voltage VE is applied to the memory cell that has been brought to an excessively high-resistance state by the overreset operation, thereby bringing the memory cell into a target range of the resistance value distribution (below, such an operation is referred to as a "partial set operation").

Figure 22:
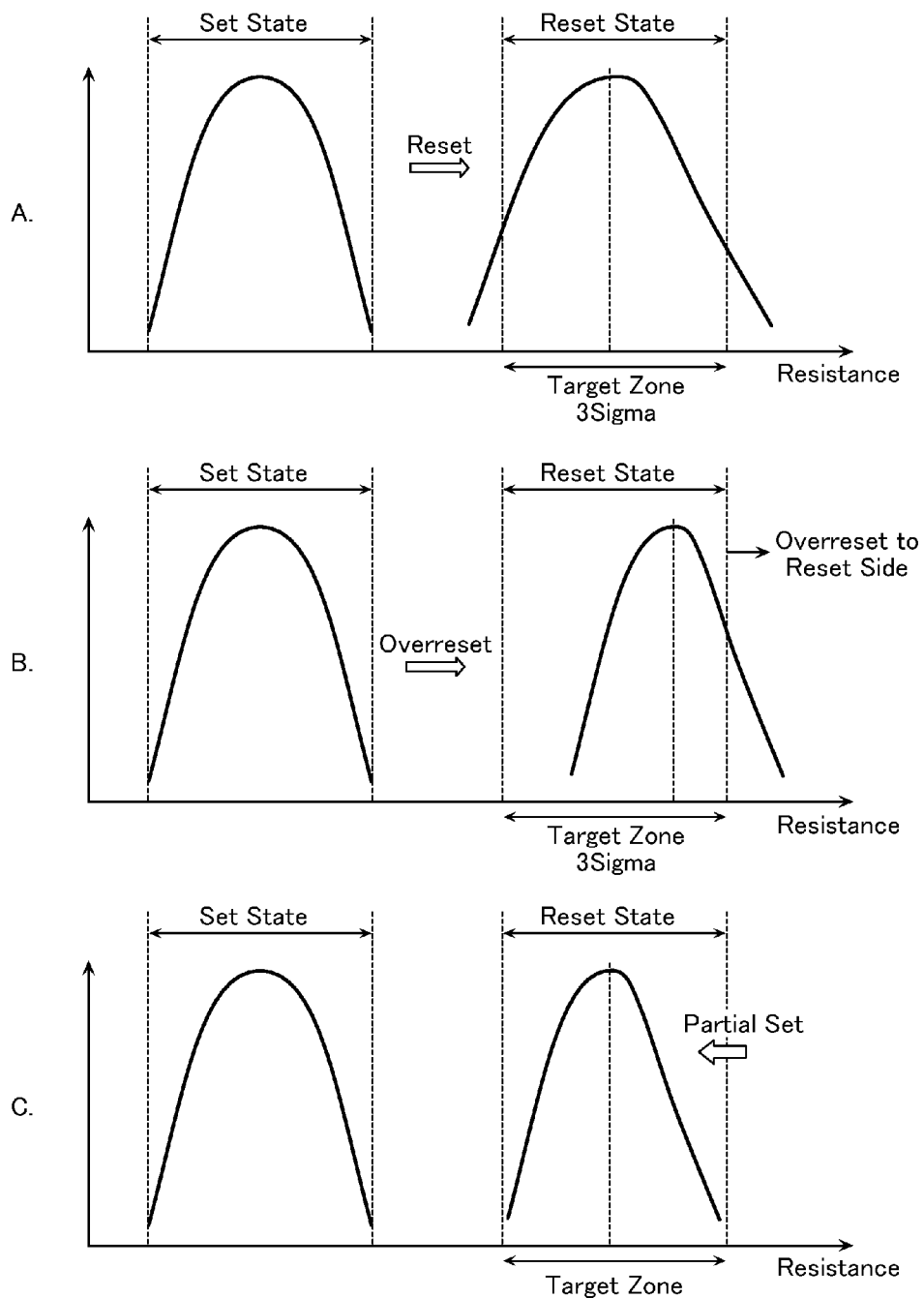
FIG. 22 is an example of a graph showing operation of a nonvolatile semiconductor memory device according to a fourth embodiment.
Figure 23A:
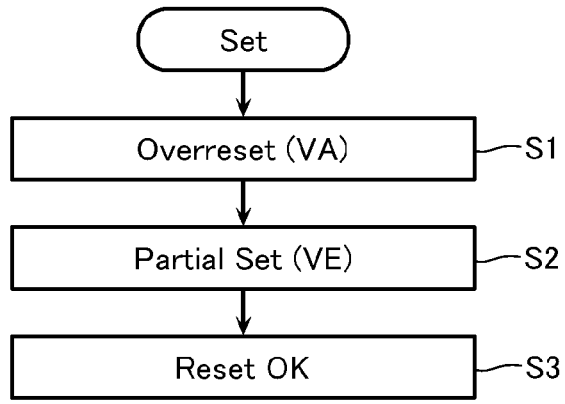
FIG. 23A is an example of a flowchart showing operation of the nonvolatile semiconductor memory device according to the fourth embodiment.

As shown in A of FIG. 22, when the resetting operation is performed on a memory cell in a set state by the operation pulse voltage VA only, the resistance value distribution of a plurality of the memory cells after the resetting operation is sometimes broader than an target resistance value distribution. Accordingly, in this embodiment, a voltage value, the number of times of applications and so on of the operation pulse voltage VA are set such that the resetting operation is performed to exceed the target range of the resistance value distribution. The resistance value distribution in B of FIG. 22 thus obtained is contrarily returned to a low-resistance side (set side) by the partial set operation employing the residual charge erase pulse voltage VE. By so doing, it is possible to bring a width of the resistance value distribution after the resetting operation into the target range, while reducing the residual charge.

Figure 23B:
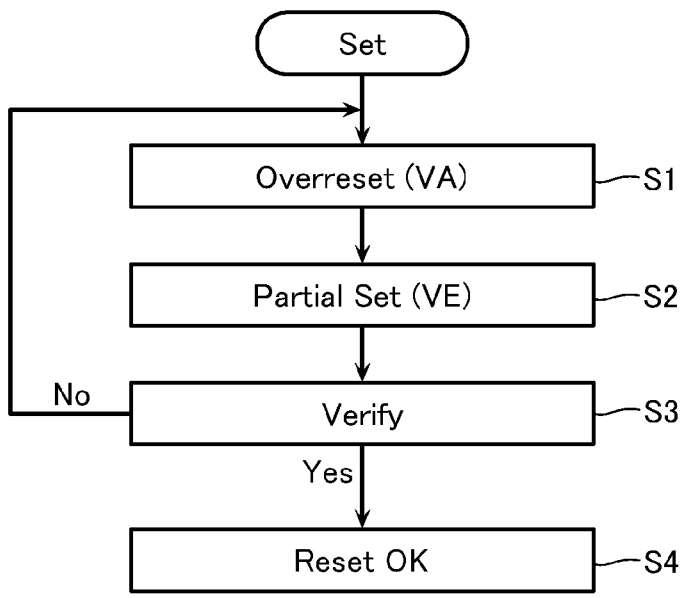
FIG. 23B is an example of a flowchart showing operation of a nonvolatile semiconductor memory device according to a modified example of the fourth embodiment.

FIG. 23B is a flowchart showing a procedure in a modified example of this fourth embodiment. In this modified example, after performing the overreset operation (S1) and the partial set operation (S2), a verify read operation for determining whether a reset state having the target resistance value distribution has been achieved or not is executed (step S3). If the desired resistance value distribution has been achieved (YES), the resetting operation finishes, and if not achieved (NO), the control circuit performs the overreset operation employing the operation pulse voltage VA (S1) and the partial set operation employing the residual charge erase pulse voltage VE (S2). Note that depending on a result of verify read, the overreset operation (S1) may be omitted and the partial set operation (S2) only performed.

Fifth Embodiment

Figure 24:
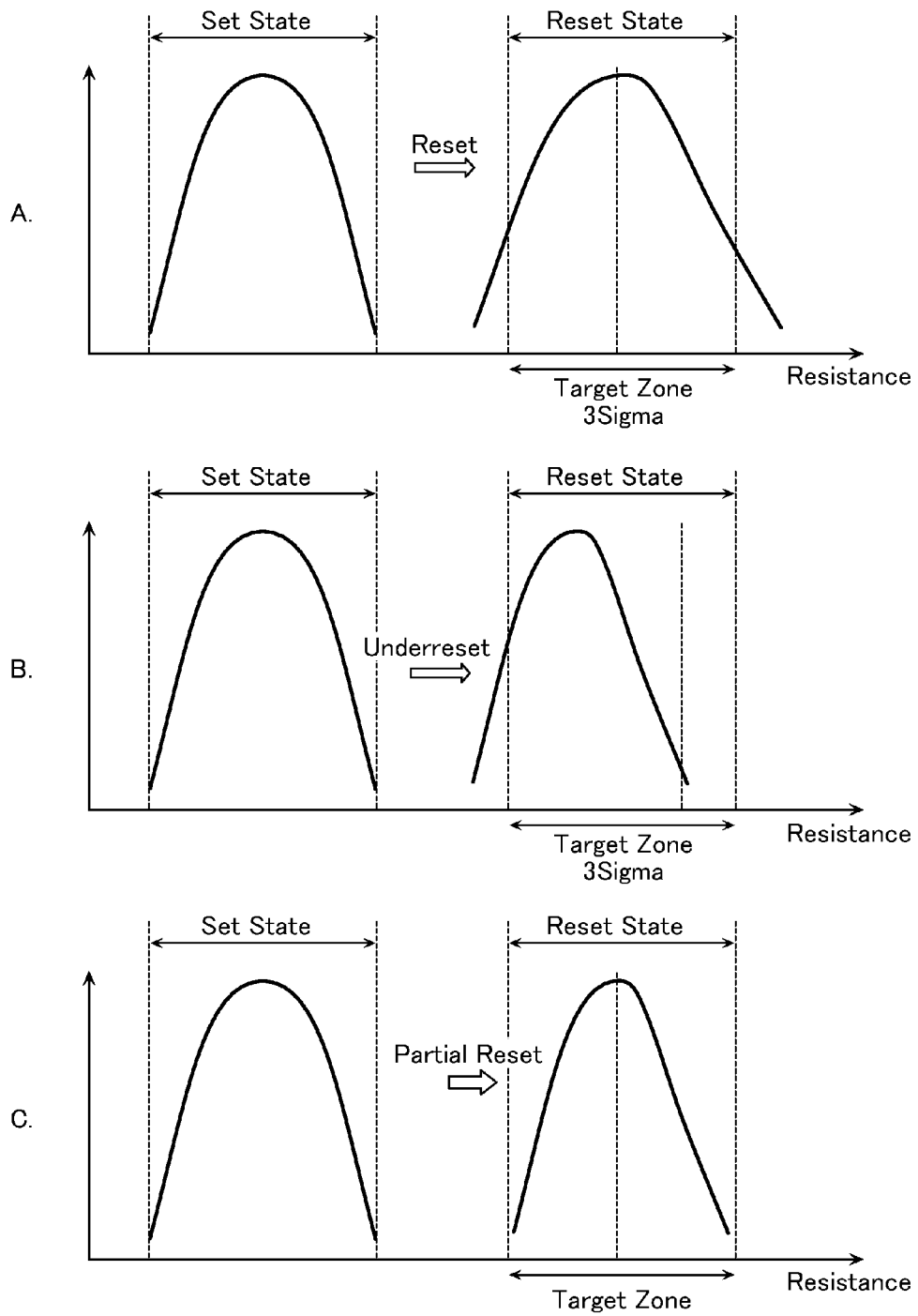
FIG. 24 is an example of a graph showing operation of a nonvolatile semiconductor memory device according to a fifth embodiment.
Figure 25A:
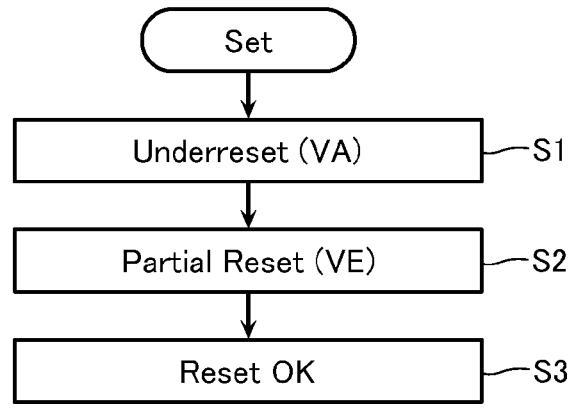
FIG. 25A is an example of a flowchart showing operation of the nonvolatile semiconductor memory device according to the fifth embodiment.

Next, a nonvolatile semiconductor memory device according to a fifth embodiment will be described with reference to FIGS. 24~25B. A schematic configuration of the device of this fifth embodiment is substantially identical to that in FIGS. 1~5, hence a duplicated description thereof is omitted below.

Also in this embodiment, similarly to in the first embodiment, an operation is performed that, for erase of the residual charge after various kinds of operations, applies the residual charge erase pulse voltage VE after application of the operation pulse voltage VA as the resetting operation. However, in this embodiment, as shown in B of FIG. 24 and in FIG. 25A (step S1), when the resetting operation is performed, the operation pulse voltage VA is applied such that the resistance value of the memory cell is not made high-resistance enough to reach a target resistance value distribution (below, such an operation is referred to as an "underreset operation"). Then, as shown in C of FIG. 24 and in FIG. 25A (step S2), the residual charge erase pulse voltage VE is applied to the memory cell that has been brought to an insufficiently high-resistance state by the underreset operation, thereby bringing the memory cell into a target range of the resistance value distribution (partial reset operation). This operation also allows substantially identical advantages to those of the fourth embodiment to be obtained.

Figure 25B:
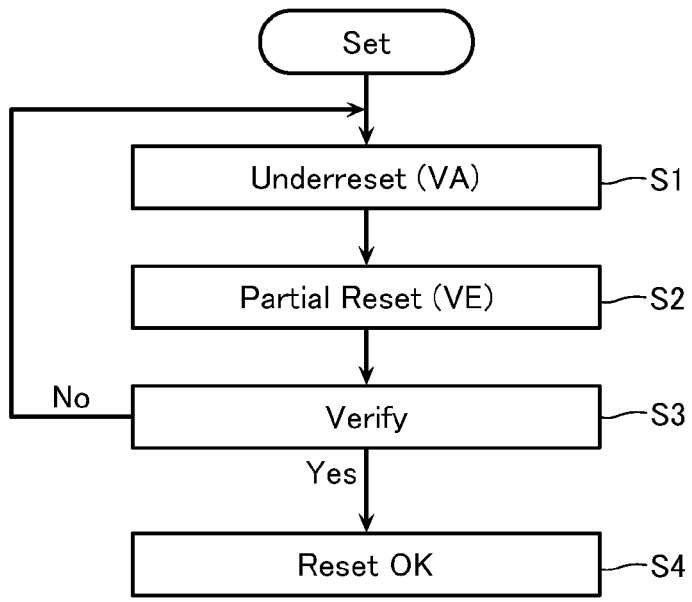
FIG. 25B is an example of a flowchart showing operation of a nonvolatile semiconductor memory device according to a modified example of the fifth embodiment.

FIG. 25B is a flowchart showing a procedure in a modified example of this fifth embodiment. In this modified example, after performing the underreset operation and the partial reset operation, a verify read operation for determining whether a reset state having the target resistance value distribution has been achieved or not is executed (step S3). If the target resistance value distribution has been achieved (YES), the resetting operation finishes, and if not achieved (NO), the control circuit performs the underreset operation employing the operation pulse voltage VA (S1) and the partial reset operation employing the residual charge erase pulse voltage VE (S2). Note that depending on a result of verify read, the underreset operation (S1) may be omitted and the partial reset operation (S2) only performed.

Sixth Embodiment

Next, a nonvolatile semiconductor memory device according to a sixth embodiment will be described with reference to FIG. 26. A schematic configuration of the device of this sixth embodiment is substantially identical to that in FIGS. 1~5, hence a duplicated description thereof is omitted below.

In this embodiment, the control circuit of the state machine 7 and so on is configured such that a certain operation is performed sequentially on the plurality of memory cells along one word line WL, for example.

Described here as an example is the case where, in a device performing the bipolar operation (FIG. 7), selection of the plurality of memory cells along one word line WL as described above is performed sequentially from left to right in FIG. 26. Now, description proceeds taking the setting operation as an example. In this case, the selected word line WL and the selected bit line BL connected to the selected memory cell are applied with the voltages V and 0 V, respectively. On the other hand, the unselected bit lines BL are applied with V/2 which is half of the voltage V. As a result, the selected memory cell is applied with a potential difference V as the previously described operation pulse voltage VA, but the half-selected memory cells along the same word line WL are applied with a potential difference V/2. Therefore, when the selected memory cell MC11 is applied with the voltage V to perform the setting operation thereon (S1) and then the memory cell MC12 adjacent to the memory cell MC11 along the same word line WL is newly applied with the potential difference V as the selected memory cell, the bit line BL connected to the immediately prior selected memory cell MC11 is applied with the potential difference V/2 (S2). This potential difference V/2 may function as the previously mentioned residual charge erase pulse voltage VE. Thereafter, a similar procedure is repeated (S3). Therefore, this sixth embodiment allows similar advantages to those of the previously described embodiments to be displayed in the case where a certain operation is executed sequentially along one word line, without the need to prepare a special pulse voltage. Note that in the above description, the example of the setting operation being performed sequentially selecting the memory cells along one word line WL has been described, but a similar operation is applicable also to the case where the resetting operation or read operation is performed. Moreover, similar advantages may be displayed also by configuring to sequentially select the memory cells along one bit line instead of sequentially selecting the memory cells along one word line.

Seventh Embodiment

Figure 27:
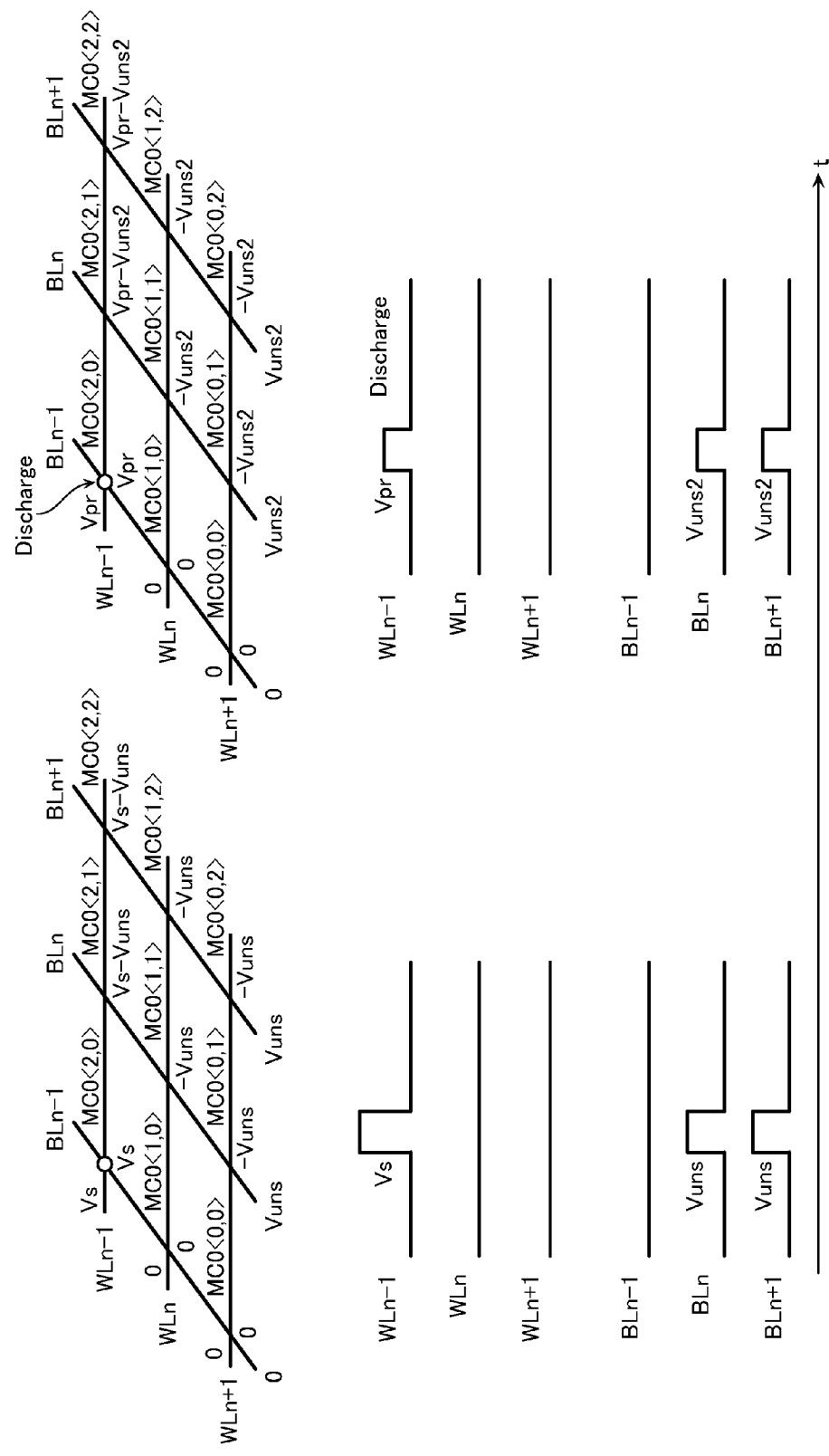
FIG. 27 is an example of a conceptual diagram showing operation of a nonvolatile semiconductor memory device according to a seventh embodiment.

Next, a nonvolatile semiconductor memory device according to a seventh embodiment will be described with reference to FIG. 27. A schematic configuration of the device of this seventh embodiment is substantially identical to that in FIGS. 1~5, hence a duplicated description thereof is omitted below.

In this embodiment, in a device performing the unipolar operation (FIG. 6), the memory cell positioned at the intersection of the word line WLn−1 and the bit line BLn−1, for example, is applied with a voltage Vs corresponding to the previously described operation pulse voltage VA to undergo the overset operation, and is then applied with a voltage Vpr corresponding to the previously described residual charge erase pulse voltage VE to undergo the partial reset operation. This is similar to the second embodiment. However, this embodiment has a feature in switching of an applied voltage of the unselected bit lines BL and the unselected word lines WL.

In the overset operation, the control circuit applies the voltage Vs to the selected word line WLn−1, while applying 0 V to the selected bit line BLn−1. As a result, both ends of the selected memory cell MC0 (2,0) are provided with a voltage difference Vs. On the other hand, the control circuit applies the unselected word lines WL and the unselected bit lines BL with 0 V and Vuns (<Vs) as voltages, respectively. As a result, the memory cells (half-selected memory cells) connected to the same word line WLn−1 as the selected memory cell MC0 (2,0) are provided with Vs−Vuns as a potential difference. Moreover, the memory cells (half-selected memory cells) connected to the same bit line BLn−1 as the selected memory cell MC0(2,0) are provided with 0 V as a potential difference. Furthermore, the unselected memory cells positioned at the intersections of the unselected word lines WL and the unselected bit lines BL are provided with −Vuns as a potential difference.

In the partial reset operation that follows, the control circuit applies the voltage Vpr (<Vs) to the selected word line WLn−1, while applying 0 V to the selected bit line BLn−1. As a result, both ends of the selected memory cell MC0(2,0) are provided with a potential difference Vpr. On the other hand, the control circuit applies the unselected word lines WL and the unselected bit lines BL with 0 V and Vuns2 (<Vuns) as voltages, respectively. As a result, the memory cells (half-selected memory cells) connected to the same word line WLn−1 as the selected memory cell MC0(2,0) are provided with Vpr−Vuns2 as a potential difference. Moreover, the memory cells (half-selected memory cells) connected to the same bit line BLn−1 as the selected memory cell MC0(2,0) are provided with 0 V as a potential difference. Furthermore, the unselected memory cells positioned at the intersections of the unselected word lines WL and the unselected bit lines BL are provided with −Vuns2 as a potential difference.

Now, in the partial reset operation, a pulse voltage of small voltage is sometimes applied a plurality of times. However, if the voltage Vpr is made small, the potential difference provided to the unselected memory cells MC0<2,1> and MC0<2,2> connected to the word line WLn−1 becomes large, leading to an increased possibility of mistaken resetting/mistaken setting occurring. Accordingly, the voltage Vpr and also the voltage Vuns2 applied to the unselected word lines and the unselected bit lines is made small. As a result, miss operation of resetting/setting of the unselected memory cells MC0<2,1> and MC0<2,2> connected to the word line WLn−1 can be prevented.

Note that the voltage Vuns2 is set to a voltage that prevents occurrence of miss operation of resetting/setting of the unselected memory cells MC0<1,1>, MC0<1,2>, MC0<0,1>, and MC0<0,2>, and so on, connected to the unselected word lines and the unselected bit lines.

Eighth Embodiment

Figure 28:
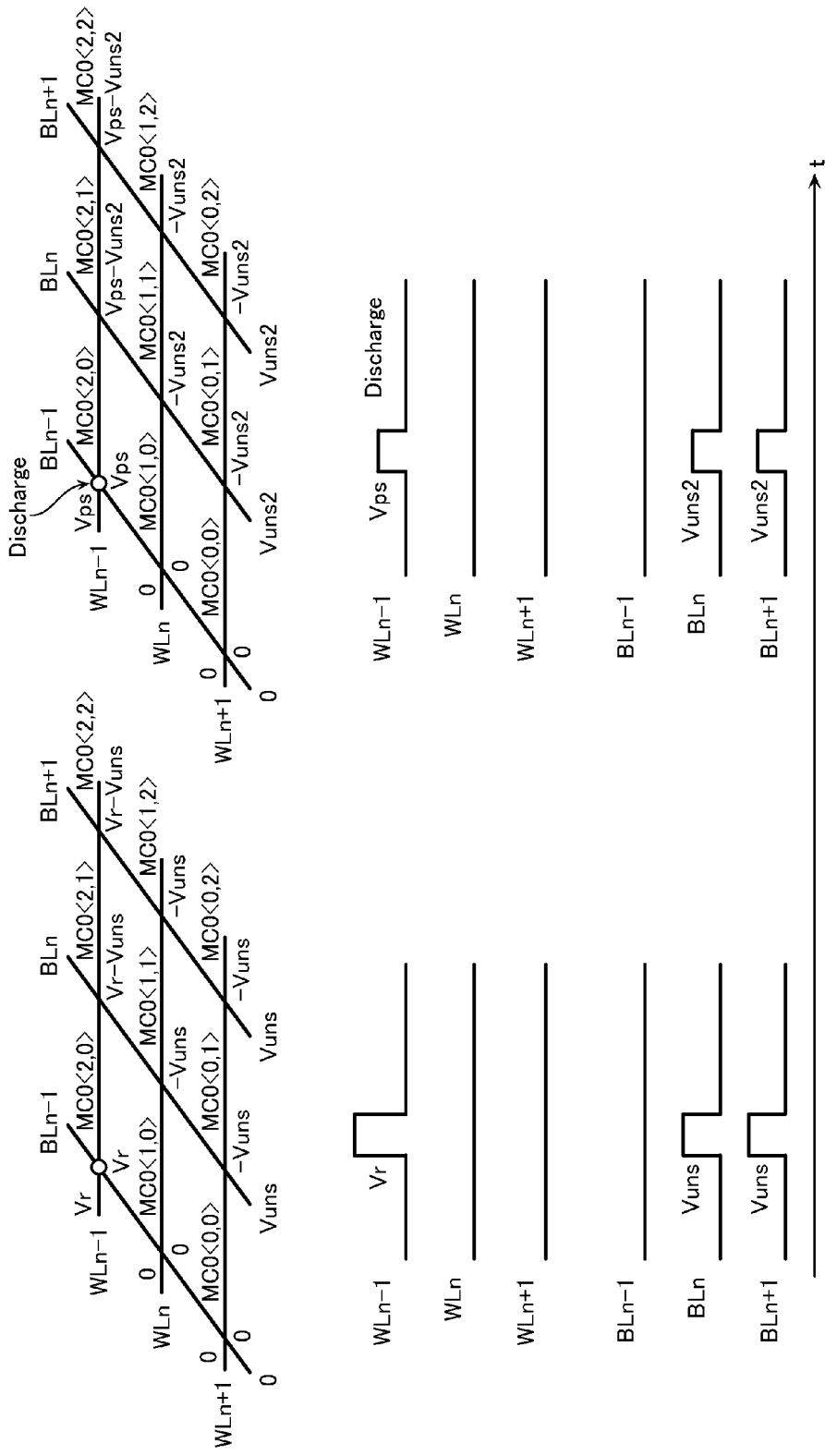
FIG. 28 is an example of a conceptual diagram showing operation of a nonvolatile semiconductor memory device according to an eighth embodiment.

Next, a nonvolatile semiconductor memory device according to an eighth embodiment will be described with reference to FIG. 28. A schematic configuration of the device of this eighth embodiment is substantially identical to that in FIGS. 1~5, hence a duplicated description thereof is omitted below.

In this embodiment, in a device performing the unipolar operation (FIG. 6), the memory cell positioned at the intersection of the word line WLn−1 and the bit line BLn−1, for example, is applied with a voltage Vr corresponding to the previously described operation pulse voltage VA to undergo the overreset operation, and is then applied with a voltage Vps corresponding to the previously described residual charge erase pulse voltage VE to undergo the partial set operation. This is similar to the fourth embodiment. However, this embodiment has a feature in switching of an applied voltage of the unselected bit lines BL and the unselected word lines WL.

In the overreset operation, the control circuit applies the voltage Vr to the selected word line WLn−1, while applying 0 V to the selected bit line BLn−1. As a result, both ends of the selected memory cell are provided with a potential difference Vr. On the other hand, the control circuit applies the unselected word lines WL and the unselected bit lines BL with 0 V and Vuns (<Vr) as voltages, respectively. As a result, the memory cells (half-selected memory cells) connected to the same word line WLn−1 as the selected memory cell are provided with Vr−Vuns as a potential difference. Moreover, the memory cells (half-selected memory cells) connected to the same bit line BLn−1 as the selected memory cell are provided with 0 V as a potential difference. Furthermore, the unselected memory cells positioned at the intersections of the unselected word lines WL and the unselected bit lines BL are provided with −Vuns as a potential difference.

In the partial set operation that follows, the control circuit applies the voltage Vps (<Vr) to the selected word line WLn−1, while applying 0 V to the selected bit line BLn−1, whereby both ends of the selected memory cell are provided with a potential difference Vps. On the other hand, the control circuit applies the unselected word lines WL and the unselected bit lines BL with 0 V and Vuns2 (<Vuns) as voltages, respectively. As a result, the memory cells (half-selected memory cells) connected to the same word line WLn−1 as the selected memory cell are provided with Vps−Vuns2 as a potential difference. Moreover, the memory cells (half-selected memory cells) connected to the same bit line BLn−1 as the selected memory cell are provided with 0 V as a potential difference. Furthermore, the unselected memory cells positioned at the intersections of the unselected word lines WL and the unselected bit lines BL are provided with −Vuns2 as a potential difference. In such a way, in this embodiment, when switching from the overreset operation to the partial set operation, only the voltage of the unselected bit lines BL is switched, the voltage of the unselected word lines WL being maintained unchanged. As a result, a higher speed operation is enabled.

Ninth Embodiment

Figure 29:
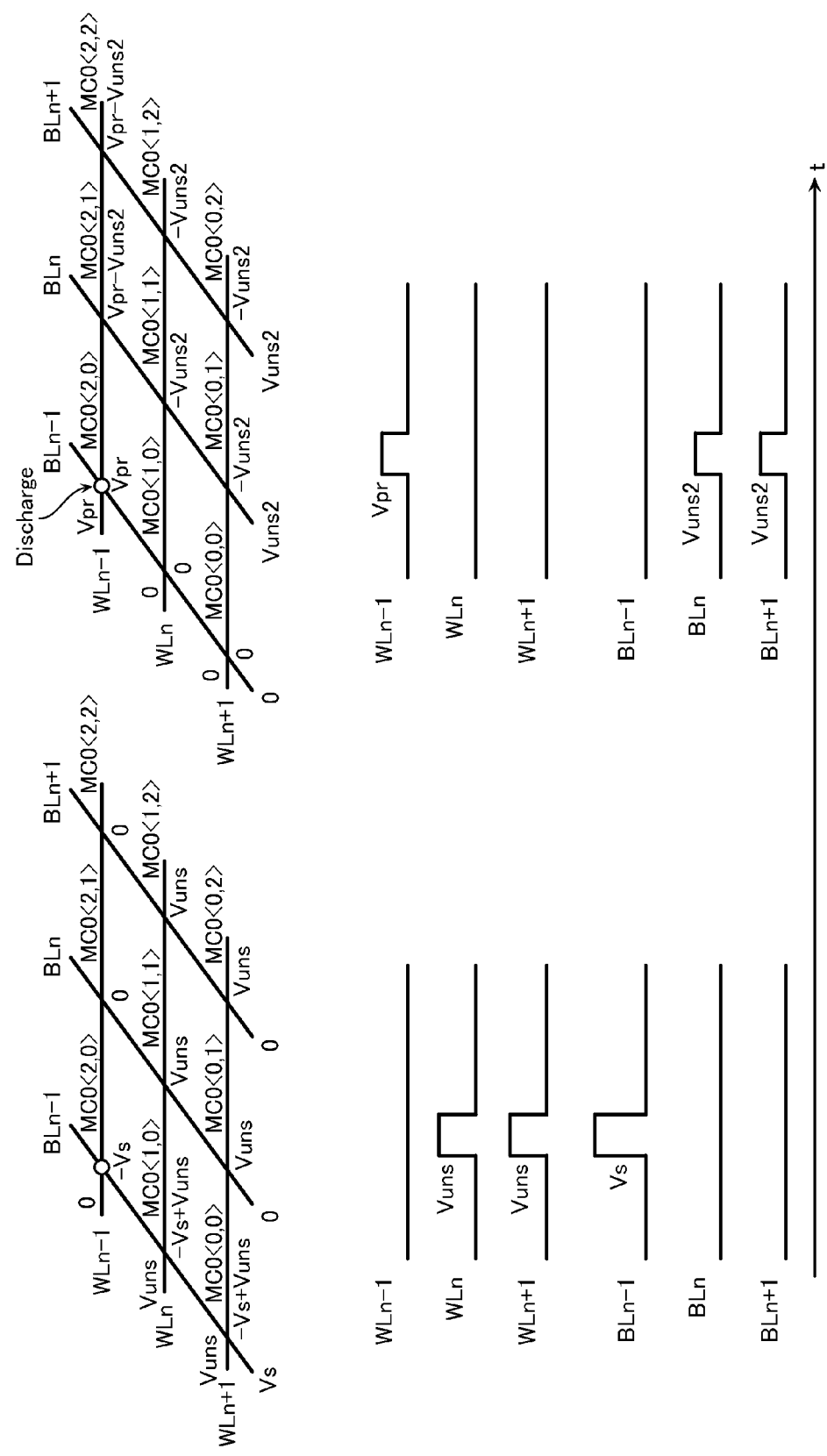
FIG. 29 is an example of a conceptual diagram showing operation of a nonvolatile semiconductor memory device according to a ninth embodiment.

Next, a nonvolatile semiconductor memory device according to a ninth embodiment will be described with reference to FIG. 29. A schematic configuration of the device of this ninth embodiment is substantially identical to that in FIGS. 1~5, hence a duplicated description thereof is omitted below.

In this embodiment, in a device performing the bipolar operation (FIG. 7), the memory cell positioned at the intersection of the word line WLn−1 and the bit line BLn−1, for example, is applied with a voltage −Vs corresponding to the previously described operation pulse voltage VA to undergo the overset operation, and is then applied with a voltage Vpr corresponding to the previously described residual charge erase pulse voltage VE to undergo the partial reset operation. This is similar to the second embodiment. However, this embodiment has a feature in switching of an applied voltage of the unselected bit lines BL and the unselected word lines WL.

In the overset operation, the control circuit applies the voltage 0 V to the selected word line WLn−1, while applying the voltage Vs to the selected bit line BLn−1. As a result, both ends of the selected memory cell are provided with a potential difference −Vs. On the other hand, the unselected word lines WL and the unselected bit lines BL are applied with Vuns (<Vs) and 0 V as voltages, respectively. As a result, the memory cells (half-selected memory cells) connected to the same word line WLn−1 as the selected memory cell are provided with 0 Vas a potential difference. Moreover, the memory cells (half-selected memory cells) connected to the same bit line BLn−1 as the selected memory cell are provided with −Vs+Vuns as a potential difference. Furthermore, the unselected memory cells positioned at the intersections of the unselected word lines WL and the unselected bit lines BL are provided with Vuns as a potential difference.

In the partial reset operation that follows, the control circuit applies the voltage Vpr (<Vs) to the selected word line WLn−1, while applying 0 V to the selected bit line BLn−1. As a result, both ends of the selected memory cell are provided with a potential difference Vpr. On the other hand, the control circuit applies the unselected word lines WL and the unselected bit lines BL with 0 V and Vuns2 (<Vuns) as voltages, respectively. As a result, the memory cells (half-selected memory cells) connected to the same word line WLn−1 as the selected memory cell are provided with Vpr−Vuns2 as a potential difference. Moreover, the memory cells (half-selected memory cells) connected to the same bit line BLn−1 as the selected memory cell are provided with 0 V as a potential difference. Furthermore, the unselected memory cells positioned at the intersections of the unselected word lines WL and the unselected bit lines BL are provided with −Vuns2 as a potential difference.

Tenth Embodiment

Figure 30:
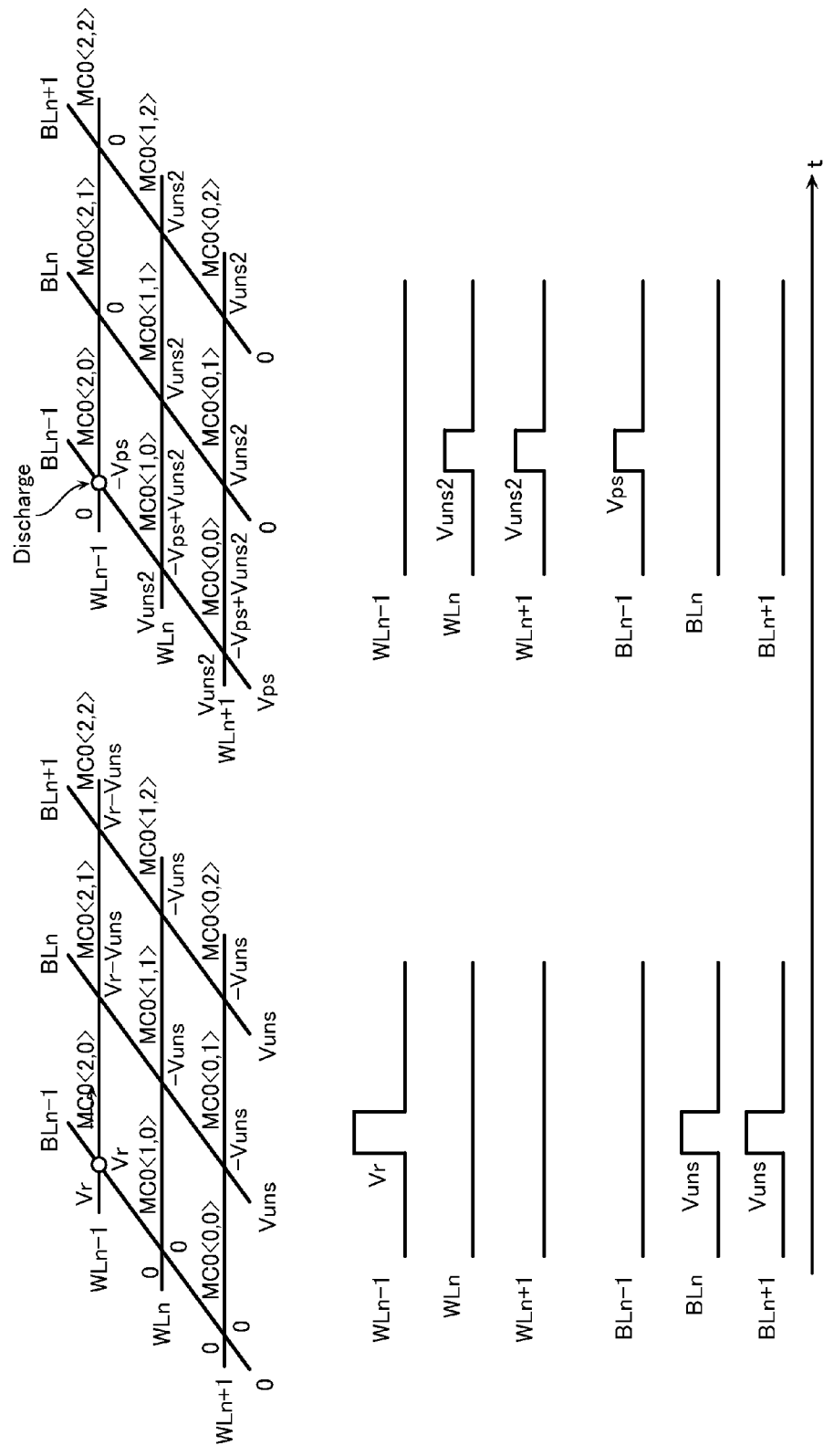
FIG. 30 is an example of a conceptual diagram showing operation of a nonvolatile semiconductor memory device according to a tenth embodiment.

Next, a nonvolatile semiconductor memory device according to a tenth embodiment will be described with reference to FIG. 30. A schematic configuration of the device of this tenth embodiment is substantially identical to that in FIGS. 1~5, hence a duplicated description thereof is omitted below.

In this embodiment, in a device performing the bipolar operation (FIG. 7), the memory cell positioned at the intersection of the word line WLn−1 and the bit line BLn−1, for example, is applied with a voltage Vr corresponding to the previously described operation pulse voltage VA to undergo the overreset operation, and is then applied with a voltage −Vps corresponding to the previously described residual charge erase pulse voltage VE to undergo the partial set operation. This is similar to the fourth embodiment. However, this embodiment has a feature in switching of an applied voltage of the unselected bit lines BL and the unselected word lines WL.

In the overreset operation, the control circuit applies the voltage Vr to the selected word line WLn−1, while applying 0 V to the selected bit line BLn−1, whereby both ends of the selected memory cell are provided with Vr as a potential difference. On the other hand, the unselected word lines WL and the unselected bit lines BL are applied with 0 V and Vuns (<Vr) as voltages, respectively. As a result, the memory cells (half-selected memory cells) connected to the same word line WLn−1 as the selected memory cell are provided with Vr−Vuns as a potential difference. Moreover, the memory cells (half-selected memory cells) connected to the same bit line BLn−1 as the selected memory cell are provided with 0 V as a potential difference. Furthermore, the unselected memory cells positioned at the intersections of the unselected word lines WL and the unselected bit lines BL are provided with −Vuns as a potential difference.

In the partial set operation that follows, the control circuit applies 0 V as a voltage to the selected word line WLn−1, while applying Vps (<Vr) as a voltage to the selected bit line BLn−1. As a result, both ends of the selected memory cell are provided with a potential difference −Vps. On the other hand, the unselected word lines WL and the unselected bit lines BL are applied with Vuns2 (<Vuns) and 0 V as voltages, respectively. As a result, the memory cells (half-selected memory cells) connected to the same word line WLn−1 as the selected memory cell are provided with 0 Vas a potential difference. Moreover, the memory cells (half-selected memory cells) connected to the same bit line BLn−1 as the selected memory cell are provided with −Vps+Vuns2 as a potential difference. Furthermore, the unselected memory cells positioned at the intersections of the unselected word lines WL and the unselected bit lines BL are provided with Vuns2 as a potential difference.

Eleventh Embodiment

Figure 31:
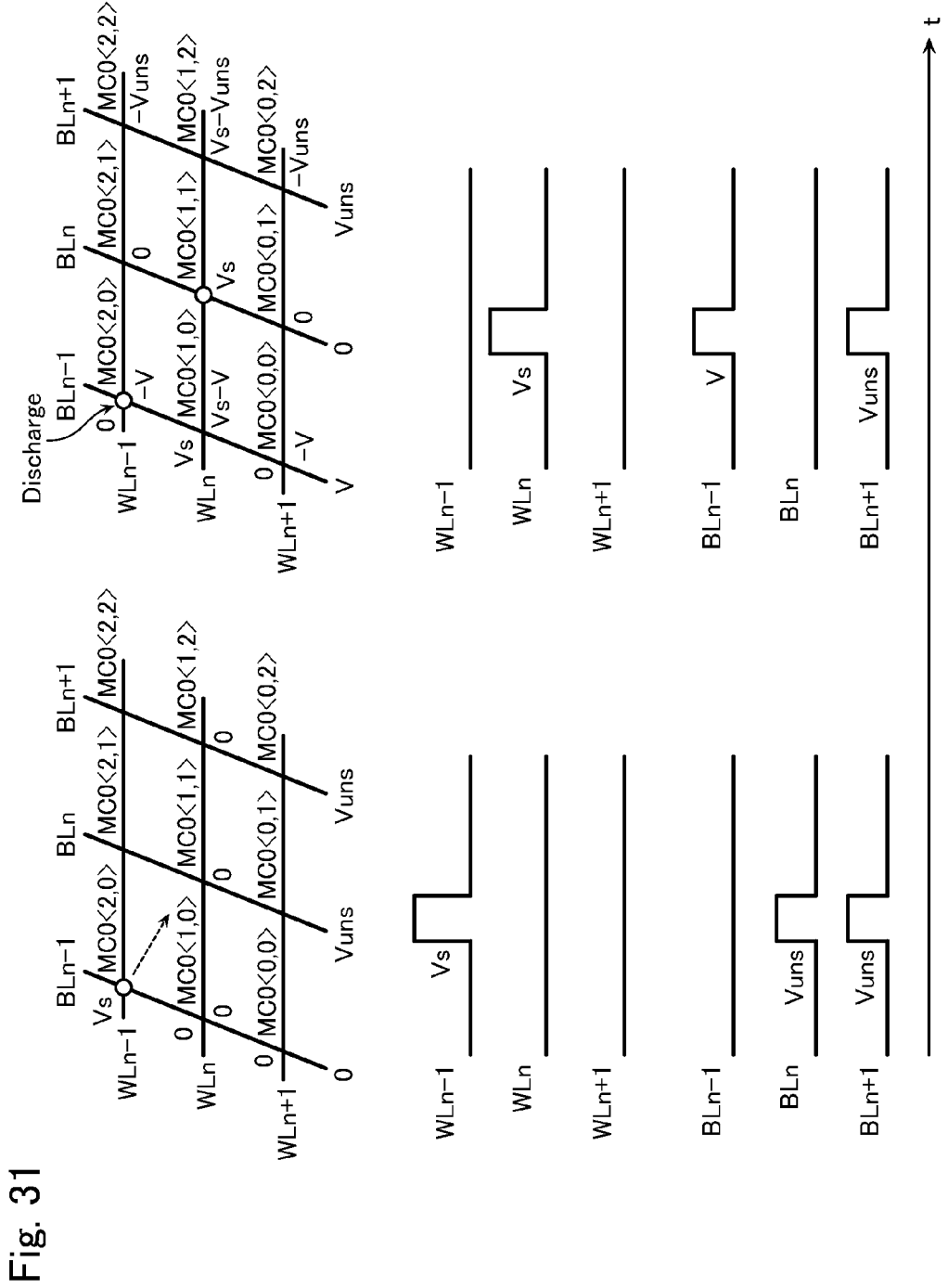
FIG. 31 is an example of a conceptual diagram showing operation of a nonvolatile semiconductor memory device according to an eleventh embodiment.

Next, a nonvolatile semiconductor memory device according to an eleventh embodiment will be described with reference to FIG. 31. A schematic configuration of the device of this eleventh embodiment is substantially identical to that in FIGS. 1~5, hence a duplicated description thereof is omitted below.

This eleventh embodiment has a feature in that when the memory cells are sequentially selected, control is performed such that the memory cell shifts in an oblique direction with respect to the bit lines BL and the word lines WL. For example, as shown in FIG. 31, first, the memory cell MC0<2,0> connected to the bit line BLn−1 and the word line WLn−1 is selected and undergoes the setting operation. At this time, the control circuit applies the voltage Vs to the selected word line WLn−1, while applying 0 V as a voltage to the selected bit line BLn−1, thereby causing a potential difference Vs to be provided to the selected memory cell MC0<2,0>. The control circuit applies 0 V to the unselected word lines WL and applies the voltage Vuns to the unselected bit lines BL.

Then, the bit line BLn adjacent to the bit line BLn−1 and the word line WLn adjacent to the word line WLn−1 are selected, whereby the memory cell MC0<1,1> is selected to undergo the setting operation (that is, the selected memory cell shifts in an oblique direction with respect to the bit lines and the word lines). At this time, the control circuit applies the voltage Vs to the selected word line WLn, while applying 0 V as a voltage to the selected bit line BLn. As a result, the control circuit causes a potential difference Vs to be provided to the selected memory cell MC0<1,1>. Note that the control circuit applies 0 V to the unselected word lines WL. Also, although the control circuit applies the voltage Vuns to the unselected bit lines BL, the bit line BLn−1 which is the selected bit line of the previous time of the setting operation is applied with the voltage V. As a result, the former selected memory cell is applied with −V as a voltage. This voltage −V functions as the residual charge erase pulse voltage VE of FIG. 9. Thereafter, the memory cell is selected repeating a similar procedure. That is, the memory cell (connected to the word line and bit line that are) respectively adjacent to the currently selected word line and bit line is selected, whereby the selected memory cell shifts in an oblique direction. That is, the next selected memory cell MC0 is a memory cell MC0 connected to (a word line and a bit line) other than an identical word line WL and an identical bit line BL. Moreover, shifting in an oblique direction includes not only the case of the selected memory cell shifting linearly in an oblique direction, but also the case of shifting in for example a zigzag direction. Furthermore, the voltage V can be adjusted in a range that prevents occurrence of miss operation of resetting/setting of the unselected memory cells MC0<1,0> and MC0<0,0>.

This embodiment enables high-speed operation without the need to apply the residual charge erase pulse voltage VE separately as a special pulse. Note that FIG. 31 described the case where the setting operation is performed, but a similar operation may be applied also to the resetting operation or the read operation.

Twelfth Embodiment

Next, a nonvolatile semiconductor memory device according to a twelfth embodiment will be described with reference to FIG. 32. A schematic configuration of the device of this twelfth embodiment is substantially identical to that in FIGS. 1~5, hence a duplicated description thereof is omitted below.

This twelfth embodiment, similarly to the eleventh embodiment, has a feature in that when the memory cells are sequentially selected, control is performed such that the memory cell shifts in an oblique direction with respect to the bit lines BL and the word lines WL. Moreover, a device performing the bipolar operation (FIG. 7) is taken as an example to describe the present embodiment.

Figure 32:
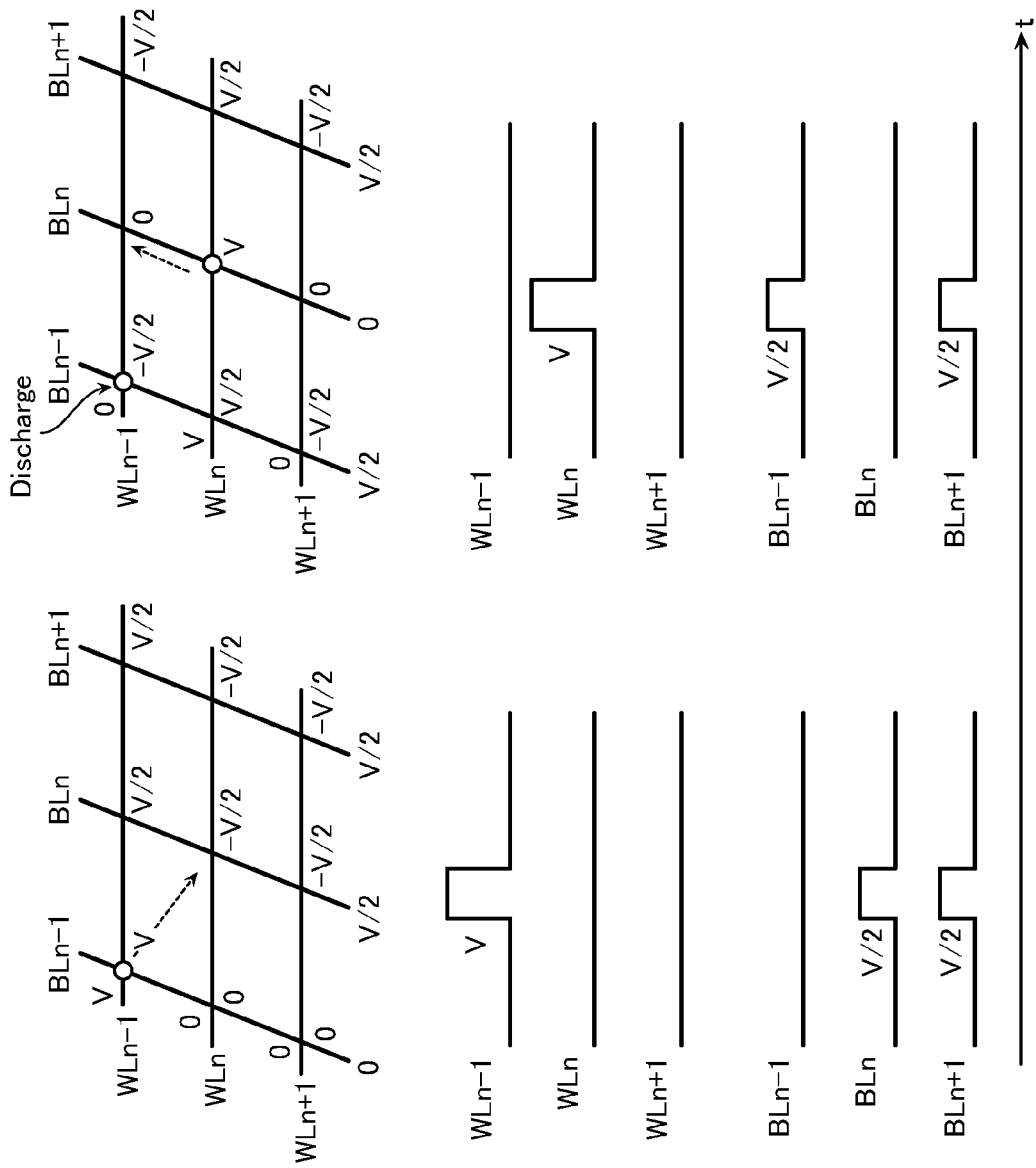
FIG. 32 is an example of a conceptual diagram showing operation of a nonvolatile semiconductor memory device according to a twelfth embodiment.

For example, as shown in FIG. 32, first, the memory cell MC0<2,0> connected to the bit line BLn-1 and the word line WLn-1 is selected and undergoes various kinds of operations. At this time, the control circuit applies the voltage V to the selected word line WLn-1, while applying 0 V as a voltage to the selected bit line BLn-1, thereby causing a potential difference V to be provided to the selected memory cell MC0<2,0>. The control circuit applies 0 V to the unselected word lines WL and applies the voltage V/2 to the unselected bit lines BL. As a result, the memory cells (half-selected memory cells) connected to the same word line WLn-1 as the selected memory cell are provided with V/2 as a potential difference. Moreover, the memory cells (half-selected memory cells) connected to the same bit line BLn-1 as the selected memory cell are provided with 0 V as a potential difference. Furthermore, the memory cells (unselected memory cells) connected to the unselected bit lines BL and the unselected word lines WL are provided with -V/2 as a potential difference.

Then, the bit line BLn adjacent to the bit line BLn-1 and the word line WLn adjacent to the word line WLn-1 are selected, whereby the next memory cell MC0<1,1> is selected to undergo various kinds of operations (that is, the selected memory cell shifts in an oblique direction with respect to the bit lines and the word lines). At this time, the control circuit applies the voltage V to the selected word line WLn, while applying 0 V as a voltage to the selected bit line BLn. As a result, a potential difference V is provided to the selected memory cell MC0<1,1>. Note that the unselected word lines WL are applied with 0 V. The unselected bit lines BL are applied with the voltage V/2. As a result, the former selected memory cell MC0<2,0> is applied with -V/2 as a potential difference. This voltage -V/2 functions as the residual charge erase pulse voltage VE of FIG. 9.

Thereafter, shifting the selected memory cell in an oblique direction in a similar manner enables similar advantages to be obtained. This embodiment enables high-speed operation without the need to apply the residual charge erase pulse voltage VE separately as a special pulse.

Note that shifting in an oblique direction may be linear shifting or may be zigzag shifting, similarly to in the eleventh embodiment.

Thirteenth Embodiment

Next, a nonvolatile semiconductor memory device according to a thirteenth embodiment will be described with reference to FIG. 33. A schematic configuration of the device of this thirteenth embodiment is substantially identical to that in FIGS. 1~5, hence a duplicated description thereof is omitted below.

This thirteenth embodiment, similarly to the eleventh and twelfth embodiments, has a feature in that when the memory cells are sequentially selected, control is performed such that the memory cell shifts in an oblique direction with respect to the bit lines BL and the word lines WL.

Figure 33:
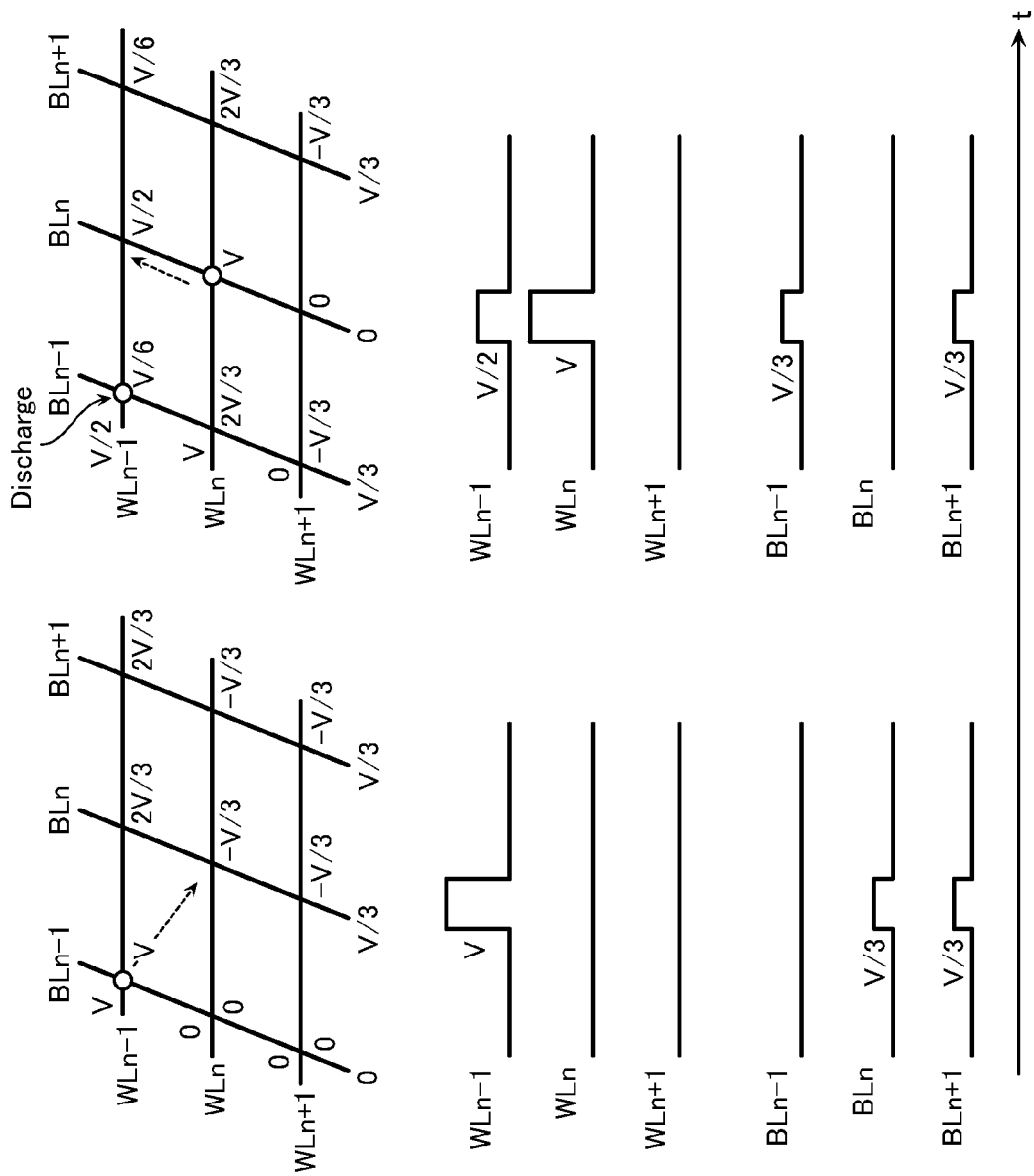
FIG. 33 is an example of a conceptual diagram showing operation of a nonvolatile semiconductor memory device according to a thirteenth embodiment.

For example, as shown in FIG. 33, first, the memory cell MC0<2,0> connected to the bit line BLn-1 and the word line WLn-1 is selected and undergoes various kinds of operations. At this time, the control circuit applies the voltage V to the selected word line WLn-1, while applying 0 V as a voltage to the selected bit line BLn-1. As a result, the control circuit causes a potential difference V to be provided to the selected memory cell. The control circuit applies 0 V to the unselected word lines WL and applies the voltage V/3 to the unselected bit lines BL. As a result, the memory cells (half-selected memory cells) connected to the same word line WLn-1 as the selected memory cell are provided with ⅔V as a potential difference. Moreover, the memory cells (half-selected memory cells) connected to the same bit line BLn-1 as the selected memory cell are provided with 0 V as a potential difference. Furthermore, the memory cells (unselected memory cells) connected to the unselected bit lines BL and the unselected word lines WL are provided with -V/3 as a potential difference.

Then, the bit line BLn adjacent to the bit line BLn-1 and the word line WLn adjacent to the word line WLn-1 are selected, whereby the next memory cell MC0<1,1> is selected to undergo various kinds of operations (that is, the selected memory cell shifts in an oblique direction with respect to the bit lines and the word lines). At this time, the control circuit applies the voltage V to the selected word line WLn, while applying 0 V as a voltage to the selected bit line BLn. As a result, the selected memory cell is provided with V as a potential difference. In addition, the control circuit applies the voltage V/3 to the unselected bit lines BL and applies 0 V to the unselected word lines WL. However, the word line WLn-1 which is the former selected word line is applied with V/2. As a result, the former selected memory cell MC0<2,0> is applied with V/6 as a voltage. This voltage V/6 functions as the residual charge erase pulse voltage VE of FIG. 9. That is, this embodiment enables high-speed operation without the need to apply the residual charge erase pulse voltage VE separately as a special pulse. Moreover, setting different values for the voltages applied to the bit line BLn-1 connected to the memory cell where a discharge is performed and the other unselected bit line BLn+1 makes it possible to adjust the potential difference applied to the memory cell where the discharge is performed.

Fourteenth Embodiment

Next, a nonvolatile semiconductor memory device according to a fourteenth embodiment will be described with reference to FIG. 34. A schematic configuration of the device of this fourteenth embodiment is substantially identical to that in FIGS. 1~5, hence a duplicated description thereof is omitted below.

This fourteenth embodiment, similarly to the eleventh through thirteenth embodiments, has a feature in that when the memory cells are sequentially selected, control is performed such that the memory cell shifts in an oblique direction with respect to the bit lines BL and the word lines WL.

Figure 34:
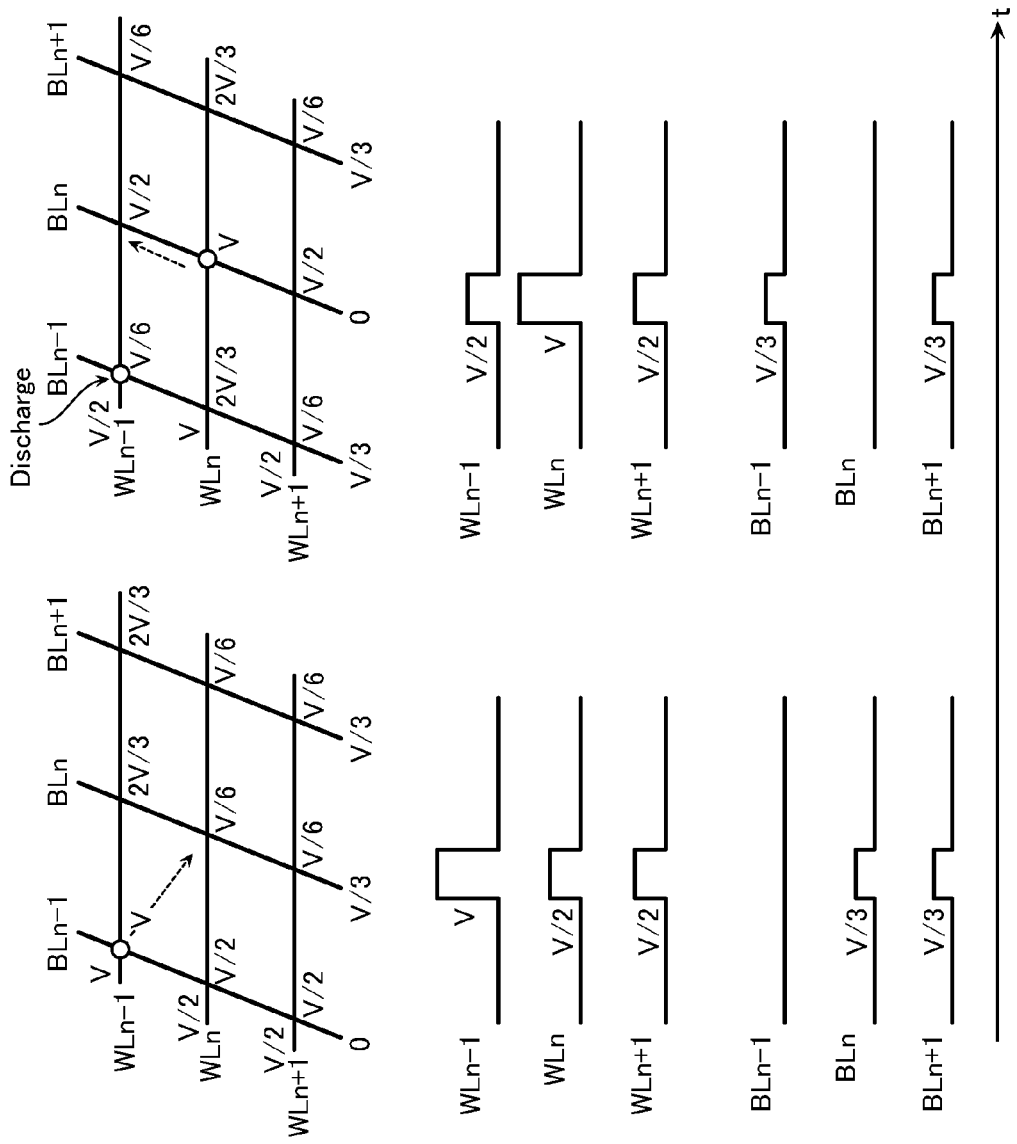
FIG. 34 is an example of a conceptual diagram showing operation of a nonvolatile semiconductor memory device according to a fourteenth embodiment.

For example, as shown in FIG. 34, first, the memory cell connected to the bit line BLn−1 and the word line WLn−1 is selected and undergoes various kinds of operations. At this time, the control circuit applies the voltage V to the selected word line WLn−1, while applying 0 V as a voltage to the selected bit line BLn−1. As a result, the selected memory cell MC0<2,0> is applied with V as a potential difference. In addition, the control circuit applies the voltage V/2 to the unselected word lines WL and applies the voltage V/3 to the unselected bit lines BL. As a result, the memory cells (half-selected memory cells) connected to the same word line WLn−1 as the selected memory cell are provided with 2/3V as a potential difference. Moreover, the memory cells (half-selected memory cells) connected to the same bit line BLn−1 as the selected memory cell are provided with V/2 as a potential difference. Furthermore, the memory cells (unselected memory cells) connected to the unselected bit lines BL and the unselected word lines WL are provided with V/6 as a potential difference.

Then, the bit line BLn adjacent to the bit line BLn−1 and the word line WLn adjacent to the word line WLn−1 are selected, whereby the next memory cell MC0<1,1> is selected to undergo various kinds of operations (that is, the selected memory cell shifts in an oblique direction with respect to the bit lines and the word lines). At this time, the control circuit applies the voltage V to the selected word line WLn, while applying 0 V as a voltage to the selected bit line BLn. As a result, the selected memory cell is provided with a potential difference V. In addition, the control circuit applies the voltage V/3 to the unselected bit lines BL and applies V/2 to the unselected word lines WL. As a result, the former selected memory cell MC0<2,0> is applied with V/6 as a potential difference. This voltage V/6 functions as the residual charge erase pulse voltage VE of FIG. 9. That is, this embodiment enables high-speed operation without the need to apply the residual charge erase pulse voltage VE separately as a special pulse. Moreover, setting different values for the voltages applied to the word line WLn−1 connected to the memory cell where a discharge is performed and the other unselected word line WLn+1 makes it possible to adjust the potential difference applied to the memory cell where the discharge is performed.

[Material of Memory Cell Array]

Finally, a summary is provided of a material employed in the memory cell array according to the above-described embodiments. Note that x and y express an arbitrary composition ratio.

<Rectifier Element>

A material of the p type semiconductor, n type semiconductor, and intrinsic semiconductor configuring the rectifier element can be selected from the group of semiconductors such as Si, SiGe, SiC, Ge, C, and so on.

Used in the junction portion with the upper semiconductor configuring the rectifier element is a silicide made of Si, Ti, V, Cr, Mn, Fe, Co, Ni, Cu, Zn, Rh, Pd, Ag, Cd, In, Sn, La, Hf, Ta, W, Re, Os, Ir, Pt, or Au. Added to these silicides are one, or two or more of Sc, Ti, V, Cr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, and Au.

The plurality of insulating layers configuring the rectifier element are selected from materials below, for example.

(1) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AM_2O_4$ where A and M are the same or different elements and are each one of Al, Sc, Ti, V, Cr, Mn, Fe, Co, Ni, Cu, Zn, Ga, and Ge.

$AM_2O_4$ includes, for example, $Fe_3O_4$, $FeAl_2O_4$, $Mn_{1+x}Al_{2-x}O_{4+y}$, $Co_{1+x}Al_{2-x}O_{4+y}$, $MnO_x$ and so on.

$AMO_3$ where A and M are the same or different elements and are each one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

$AMO_3$ includes, for example, $LaAlO_3$, $SrHfO_3$, $SrZrO_3$, $SrTiO_3$, and so on.

(2) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON a material having a portion of the oxygen element of the oxides indicated in (1) above replaced by a nitrogen element.

Specifically, the insulating layers configuring the rectifier element are each preferably selected from the group of $SiO_2$, SiN, $Si_3N_4$, $Al_2O_3$, SiON, $HfO_2$, HfSiON, $Ta_2O_5$, $TiO_2$, and $SrTiO_3$.

Note that an insulating film of a Si system such as $SiO_2$, SiN, SiON, and so on, includes an insulating film where concentrations of the oxygen element and the nitrogen element are each $1\times10^{18}$ atoms/cm$^3$ or more.

However, barrier heights of the plurality of insulating layers differ from each other.

Moreover, the insulating layer also includes a material including an impurity atom forming a defect level, or a semiconductor/metal dot (quantum dot).

<Variable Resistance Element>

The variable resistance element of the memory cell MC or a memory layer in the case of a memory function being incorporated in the rectifier element of the memory cell MC includes materials below, for example.

(1) Oxide $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO $AM_2O_4$ where A and M are the same or different elements and are each one of Al, Sc, Ti, V, Cr, Mn, Fe, Co, Ni, Cu, Zn, Ga, and Ge.

$AM_2O_4$ includes, for example, $Fe_3O_4$, $FeAl_2O_4$, $Mn_{1+x}Al_{2-x}O_{4+y}$, $Co_{1+x}Al_{2-x}O_{4+y}$, $MnO_x$, and so on.

$AMO_3$ where A and M are the same or different elements and are each one of or a combination of a plurality of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn.

$AMO_3$ includes, for example, $LaAlO_3$, $SrHfO_3$, $SrZrO_3$, $SrTiO_3$, and so on.

(2) Oxynitride

SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON

The memory element is configured from, for example, a binary-system or ternary-system metal oxide or organic material (including a single layer film or nanotube). For example, if carbon, it includes a two-dimensional structure of a single layer film, a nanotube, graphene, fullerene, and so on. The metal oxide includes the oxide indicated in (1) above or the oxynitride indicated in (2) above.

<Electrode Layer>

The electrode layer employed in the memory cell MC may include a single metal element or a composite of a plurality of metal elements, a silicide or an oxide, a nitride, and so on.

Specifically, the electrode layer is configured from the likes of Pt, Au, Ag, TiAlN, SrRuO, Ru, RuN, Ir, Ti, V, Cr, Mn, Fe, Co, Ni, Cu, TiN, TaN, LaNiO, Al, PtIrO$_x$, PtRhO$_x$, Rh, TaAlN, SiTiO$_x$, WSi$_x$, TaSi$_x$, PdSi$_x$, PtSi$_x$, IrSi$_x$, ErSi$_x$, YSi$_x$, HfSi$_x$, NiSi$_x$, CoSi$_x$, TiSi$_x$, VSi$_x$, CrSi$_x$, MnSi$_x$, and FeSi$_x$.

The electrode layer may simultaneously function as a barrier metal layer or an adhesive layer.

<Word Line WL and Bit Line BL>

The conductive line functioning as the word line WL and the bit line BL of the memory cell array 1 is configured from the likes of W, WN, Al, Ti, V, Cr, Mn, Fe, Co, Ni, Cu, TiN, WSi$_x$, TaSi$_x$, PdSi$_x$, ErSi$_x$, YSi$_x$, PtSi$_x$, HfSi$_x$, NiSi$_x$, CoSi$_x$, TiSi$_x$, VSi$_x$, CrSi$_x$, MnSi$_x$, and FeSi$_x$.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including a plurality of bit lines, a plurality of word lines intersecting the plurality of bit lines, and memory cells provided at intersections of the plurality of bit lines and the plurality of word lines; and
   a control unit configured to control a voltage applied to the bit lines and word lines,
   the memory cell including a variable resistance element and a rectifier element, and
   the control unit being configured to:
   apply a third voltage to a selected bit line and apply a fourth voltage to a selected word line;
   apply a fifth voltage different from the third voltage to unselected bit lines excluding the selected bit line and apply a sixth voltage different from the fourth voltage to unselected word lines excluding the selected word line; and
   provide a selected memory cell with a first potential difference as a difference between the third voltage and the fourth voltage at a first operation, and provide the memory cell where the first operation has finished with a second potential difference as a difference between the third voltage and the sixth voltage or a difference between the fourth voltage and the fifth voltage, the second potential difference being for erasing a residual charge.

2. The nonvolatile semiconductor memory device according to claim 1, wherein the control unit is configured to change a resistance value of the memory cell so that resistance values of a portion of the plurality of the memory cells exceed a target range, by the first potential difference, and then controls the resistance values of the memory cells within the target range, by the second potential difference.

3. The nonvolatile semiconductor memory device according to claim 2, wherein the control unit is configured to perform a setting operation for changing the resistance value of the memory cell from a high-resistance state to a low-resistance state by the first potential difference.

4. The nonvolatile semiconductor memory device according to claim 2, wherein the control unit is configured to perform a resetting operation for changing the resistance value of the memory cell from a low-resistance state to a high-resistance state by the first potential difference.

5. The nonvolatile semiconductor memory device according to claim 2, wherein the control unit is configured to, after providing the second potential difference, execute a verify operation for determining whether the resistance value of the memory cell is within the target range or not.

6. The nonvolatile semiconductor memory device according to claim 1, wherein the control unit is configured to change a resistance value of the plurality of memory cells so that resistance values of a portion of the plurality of the memory cells exceed a target range by the first potential difference, and then controls the resistance values of the memory cells within the target range, by the second potential difference.

7. The nonvolatile semiconductor memory device according to claim 6, wherein the control unit is configured to perform a setting operation for changing the resistance value of the memory cell from a high-resistance state to a low-resistance state by the first potential difference.

8. The nonvolatile semiconductor memory device according to claim 6, wherein the control unit is configured to perform a resetting operation for changing the resistance value of the memory cell from a low-resistance state to a high-resistance state by the first potential difference.

9. The nonvolatile semiconductor memory device according to claim 6, wherein the control unit is configured to, after providing the second potential difference, execute a verify operation for determining whether the resistance value of the memory cell is within the target range or not.

10. The nonvolatile semiconductor memory device according to claim 1, wherein the control unit is configured to sequentially select a plurality of the memory cells disposed along an identical bit line or word line thereby executing the first operation.

11. A nonvolatile semiconductor memory device, comprising:
    a memory cell array including a plurality of bit lines, a plurality of word lines intersecting the plurality of bit lines, and memory cells provided at intersections of the plurality of bit lines and the plurality of word lines; and
    a control unit configured to control a voltage applied to the bit lines and word lines,
    the memory cell including a variable resistance element and a rectifier element, and
    the control unit being configured to:
    apply a third voltage to a selected bit line and apply a fourth voltage to a selected word line;
    apply a fifth voltage different from the third voltage to unselected bit lines excluding the selected bit line and apply a sixth voltage different from the fourth voltage to unselected word lines excluding the selected word line; and
    provide a selected memory cell with a first potential difference as a difference between the third voltage and the fourth voltage at a first operation, and provide the memory cell where the first operation has finished with a second potential difference as a difference between the fifth voltage and the sixth voltage, the second potential difference being for erasing a residual charge.

12. The nonvolatile semiconductor memory device according to claim 11, wherein the control unit is configured to change a resistance value of the memory cell so that resistance values of a portion of the plurality of the memory cells exceed a target range, by the first potential difference, and then controls the resistance values of the memory cells within the target range, by the second potential difference.

13. The nonvolatile semiconductor memory device according to claim 12, wherein the control unit is configured to perform a setting operation for changing the resistance value of the memory cell from a high-resistance state to a low-resistance state by the first potential difference.

14. The nonvolatile semiconductor memory device according to claim 12, wherein the control unit is configured to perform a resetting operation for changing the resistance value of the memory cell from a low-resistance state to a high-resistance state by the first potential difference.

15. The nonvolatile semiconductor memory device according to claim 12, wherein the control unit is configured to, after providing the second potential difference, execute a verify operation for determining whether the resistance value of the memory cell is within the target range or not.

16. The nonvolatile semiconductor memory device according to claim 11, wherein the control unit is configured to change a resistance value of the plurality of memory cells so that resistance values of a portion of the plurality of the memory cells exceed a target range by the first potential difference, and then controls the resistance values of the memory cells within the target range, by the second potential difference.

17. The nonvolatile semiconductor memory device according to claim 16, wherein the control unit is configured to perform a setting operation for changing the resistance value of the memory cell from a high-resistance state to a low-resistance state by the first potential difference.

18. The nonvolatile semiconductor memory device according to claim 16, wherein the control unit is configured to perform a resetting operation for changing the resistance value of the memory cell from a low-resistance state to a high-resistance state by the first potential difference.

19. The nonvolatile semiconductor memory device according to claim 16, wherein the control unit is configured to, after providing the second potential difference, execute a verify operation for determining whether the resistance value of the memory cell is within the target range or not.

20. The nonvolatile semiconductor memory device according to claim 11, wherein the control unit is configured to sequentially select a memory cell connected to a bit line and word line different from the bit line and word line to which the selected memory cell is connected thereby executing the first operation.

* * * * *